(12) United States Patent
Iwayama

(10) Patent No.: US 7,999,246 B2
(45) Date of Patent: Aug. 16, 2011

(54) SEMICONDUCTOR MEMORY DEVICE AND METHOD OF MANUFACTURING THE SAME

(75) Inventor: Masayoshi Iwayama, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 328 days.

(21) Appl. No.: 12/048,819

(22) Filed: Mar. 14, 2008

(65) Prior Publication Data

US 2008/0224117 A1 Sep. 18, 2008

(30) Foreign Application Priority Data

Mar. 16, 2007 (JP) ................................. 2007-069169

(51) Int. Cl.
*H01L 31/29* (2006.01)

(52) U.S. Cl. .............................. 257/2; 257/430; 438/187

(58) Field of Classification Search .............. 257/2, 530; 438/187; 365/225
See application file for complete search history.

(56) References Cited

U.S. PATENT DOCUMENTS

| 7,132,348 B2 * | 11/2006 | Geusic et al. ................. 438/421 |
| 7,671,377 B2 * | 3/2010 | Kim et al. ....................... 257/98 |
| 2007/0072132 A1 | 3/2007 | Kamijima et al. |

FOREIGN PATENT DOCUMENTS

| JP | 5-198817 | 8/1993 |
| JP | 6-77180 | 3/1994 |
| JP | 7-263677 | 10/1995 |
| JP | 2001-156283 | 6/2001 |
| JP | 2006-156657 | 6/2006 |
| JP | 2007-180474 | 7/2007 |
| JP | 2008-523605 | 7/2008 |
| WO | WO 2006/064441 A2 | 6/2006 |

* cited by examiner

*Primary Examiner* — Long Pham
*Assistant Examiner* — Steven H Rao
(74) *Attorney, Agent, or Firm* — Oblon, Spivak, McClelland, Maier & Neustadt, L.L.P.

(57) ABSTRACT

A semiconductor memory device includes a first resistance change element having a first portion and a second portion, the first portion and the second portion having a first space in a first direction, and a second resistance change element formed to have a distance to the first resistance change element in the first direction, and having a third portion and a fourth portion, the third portion and the fourth portion having a second space in the first direction, and the first space and the second space being shorter than the distance.

9 Claims, 21 Drawing Sheets

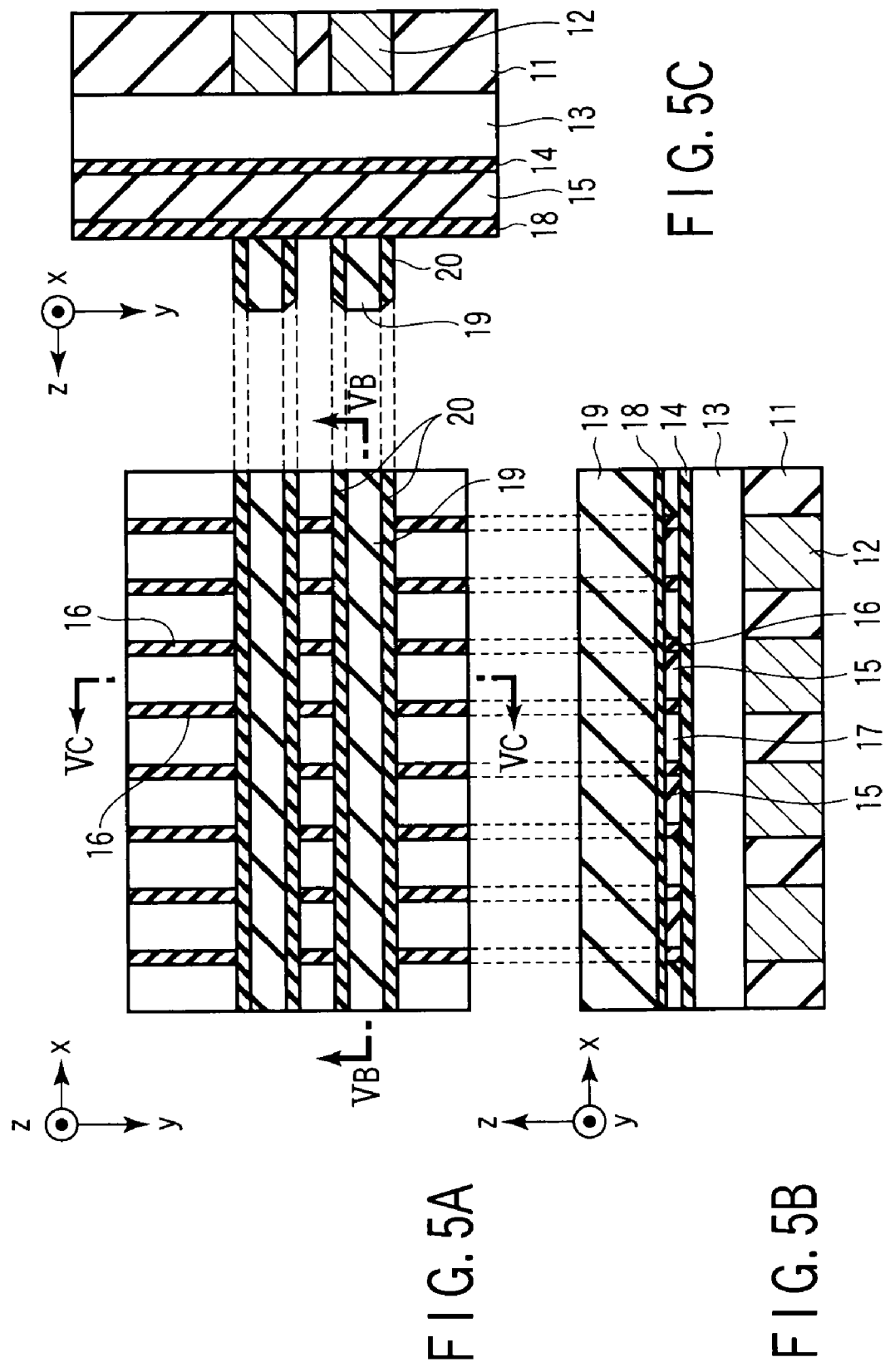

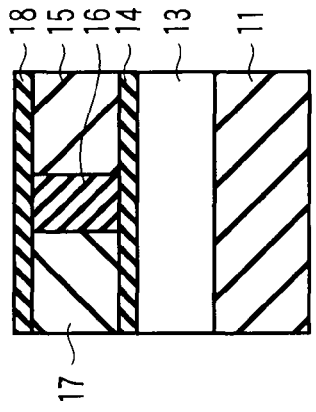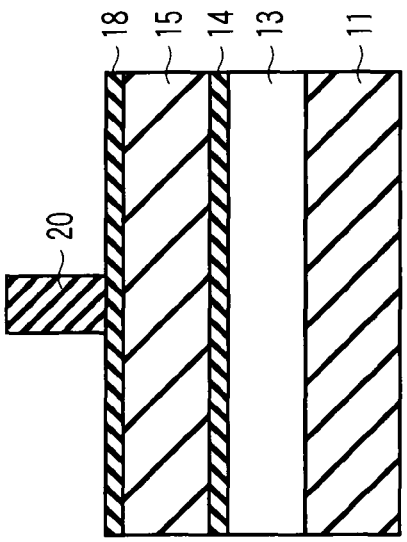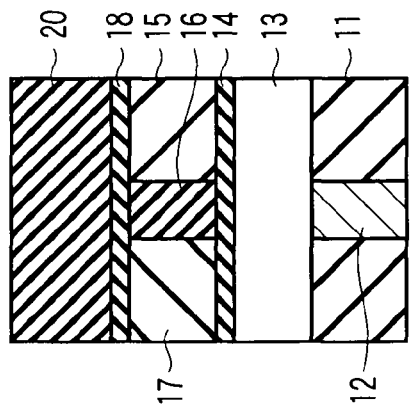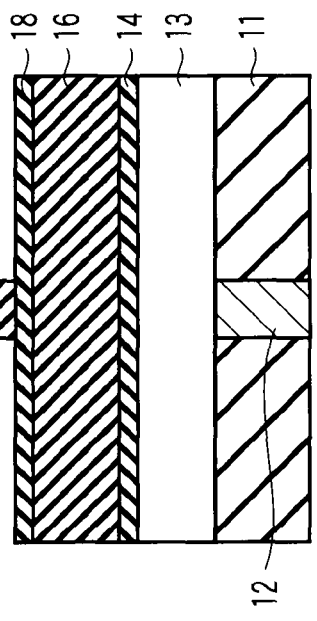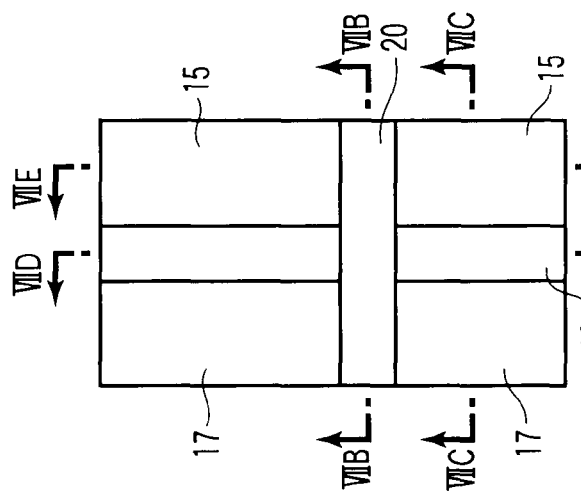

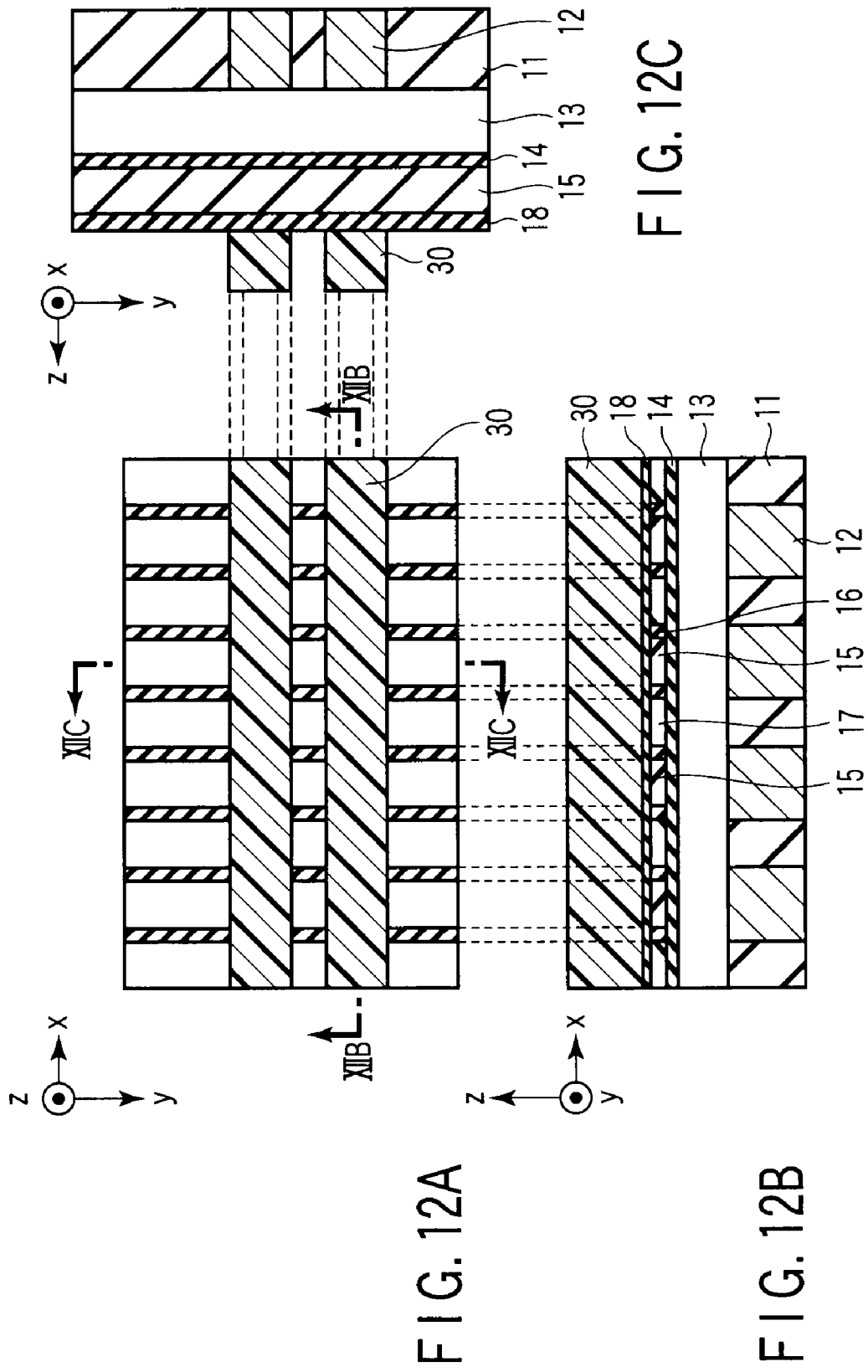

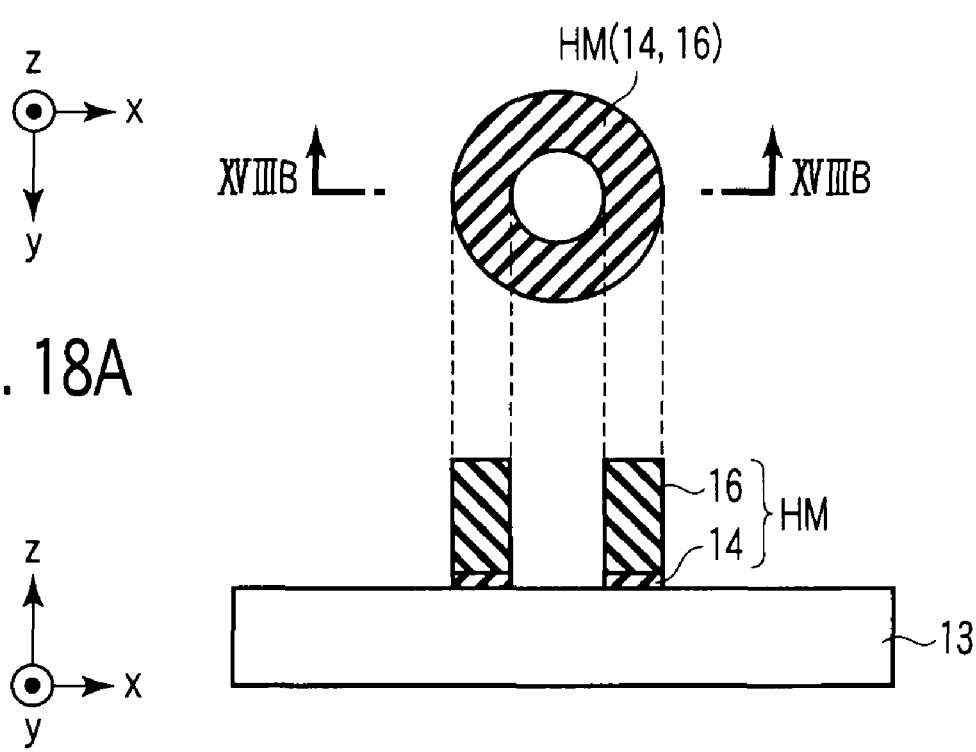
F I G. 18A
F I G. 18B

FIG. 23A
FIG. 23B
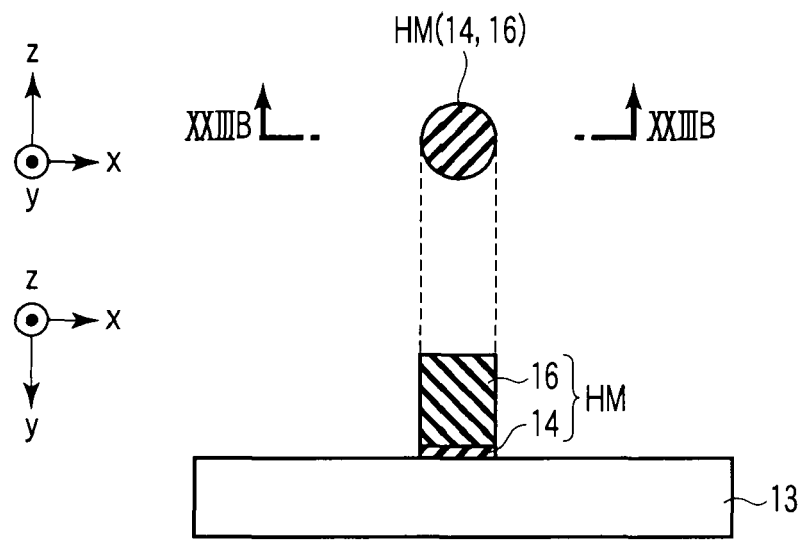
FIG. 24
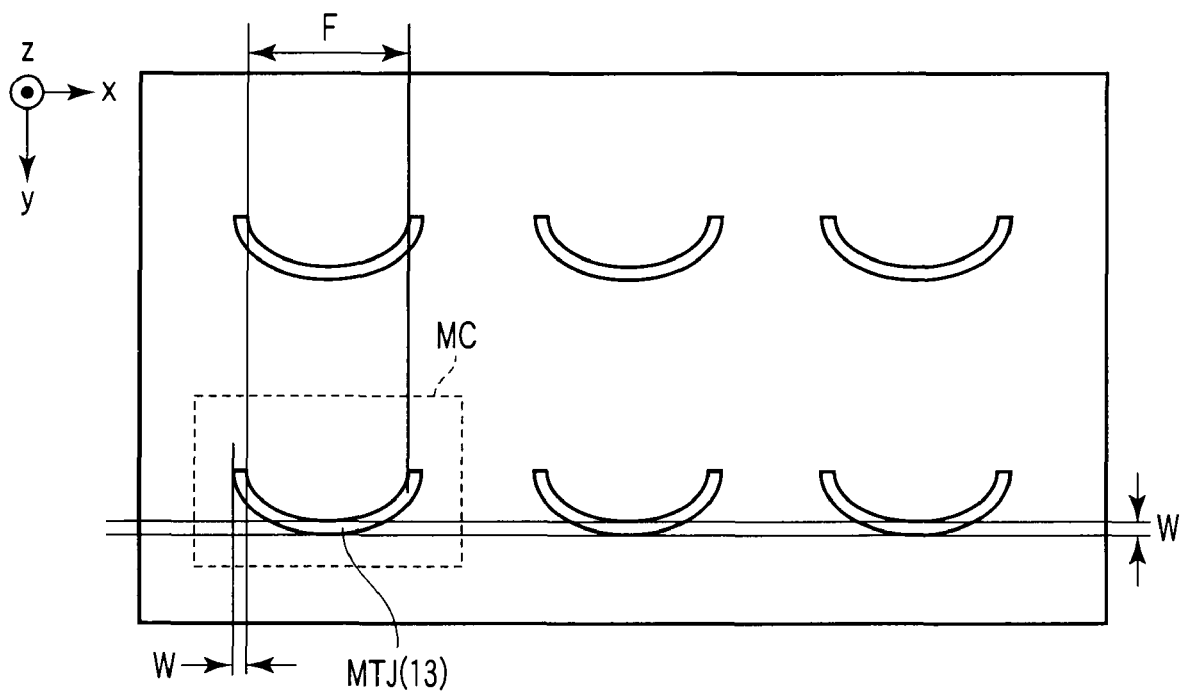

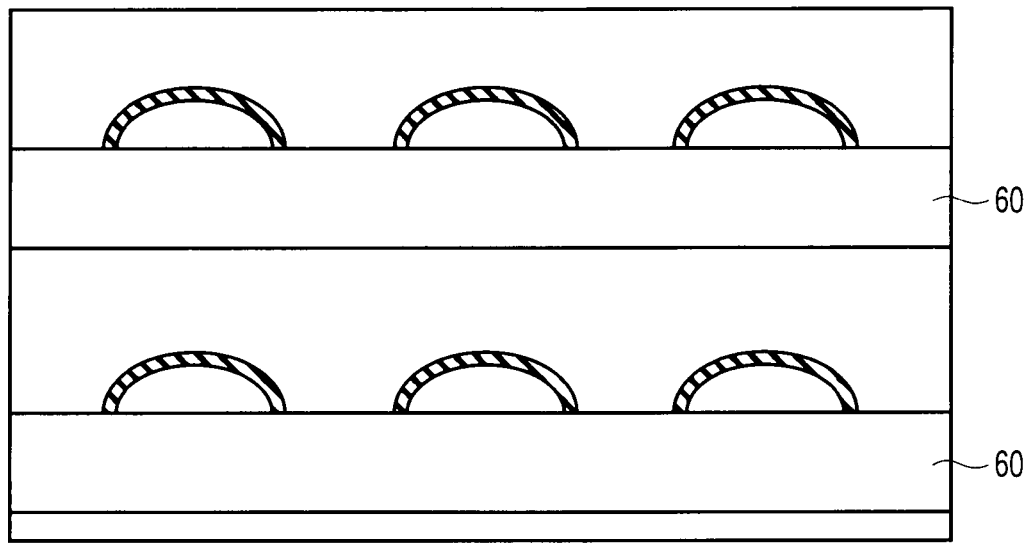
F I G. 27
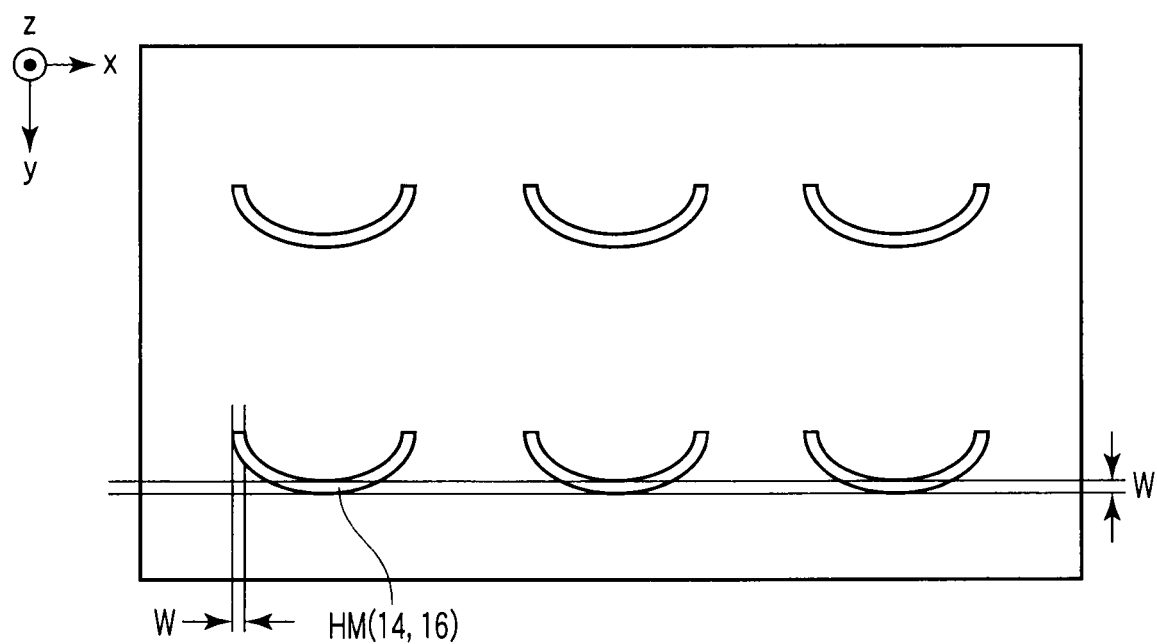
F I G. 28

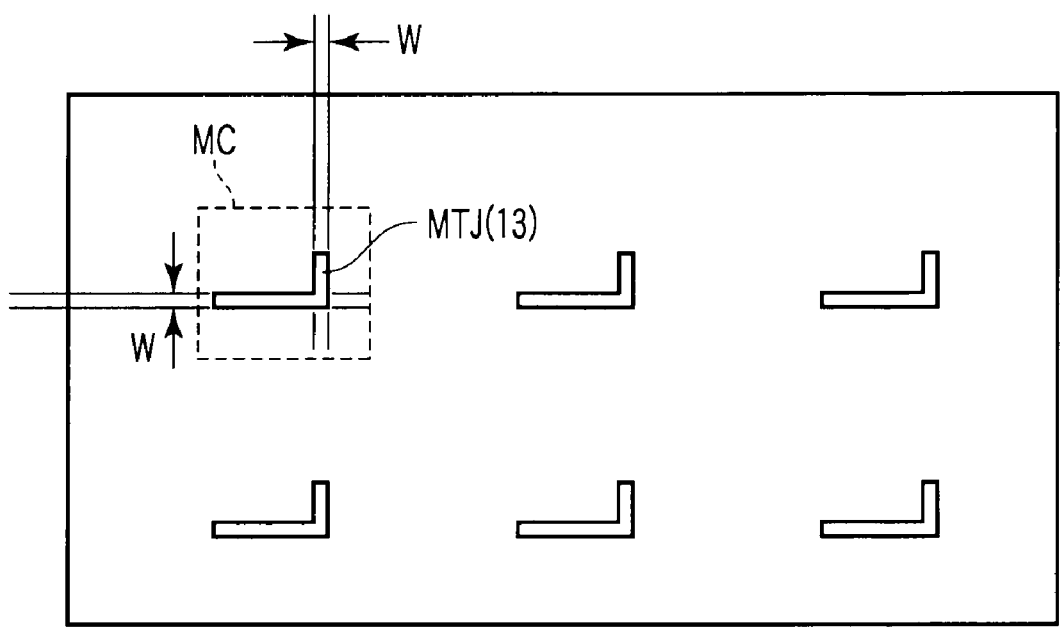
F I G. 29
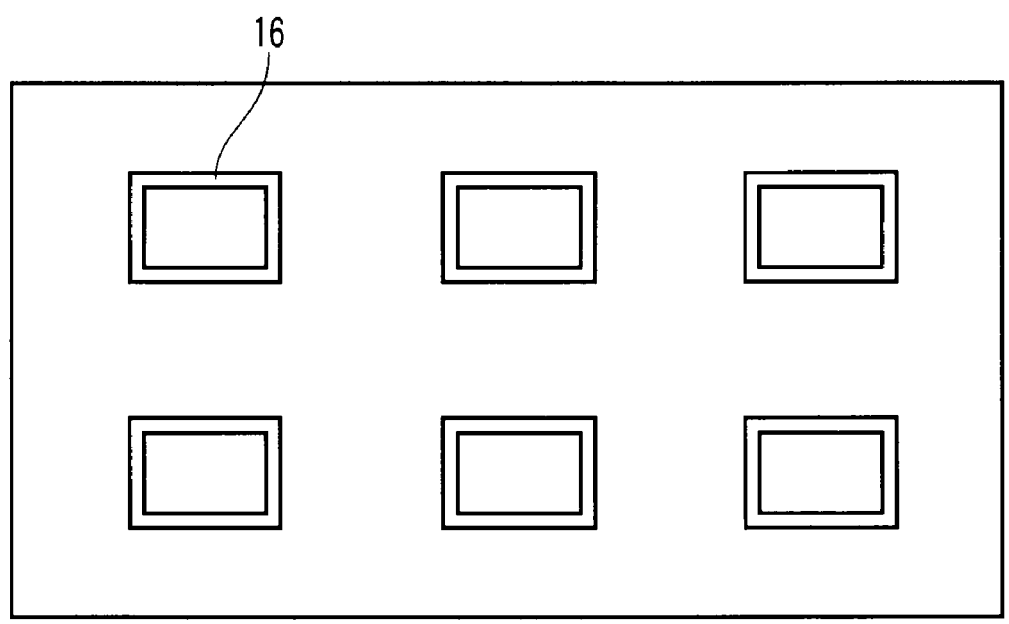
F I G. 30

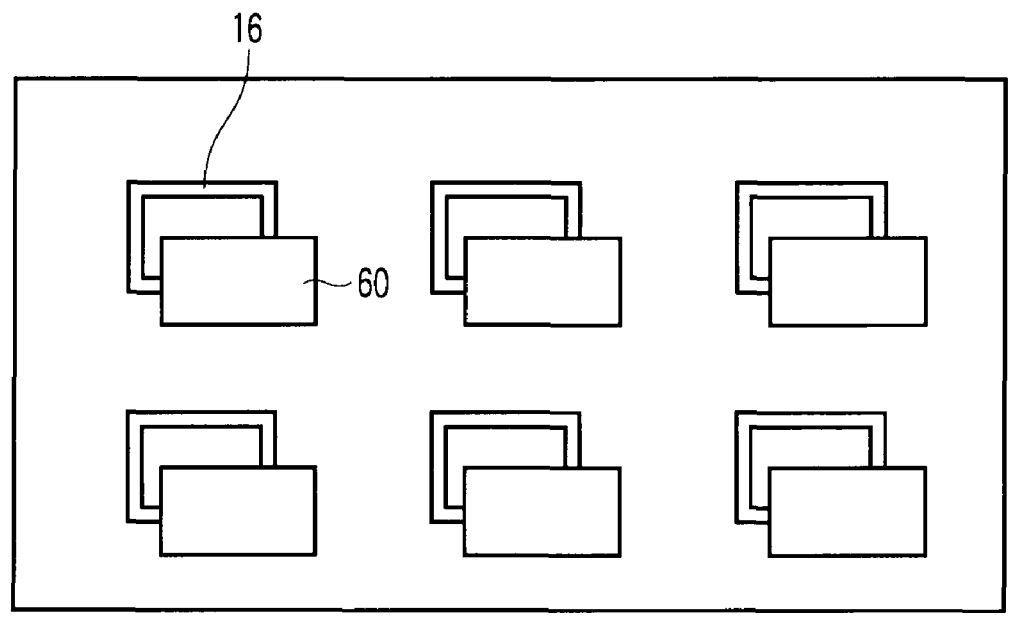
F I G. 31
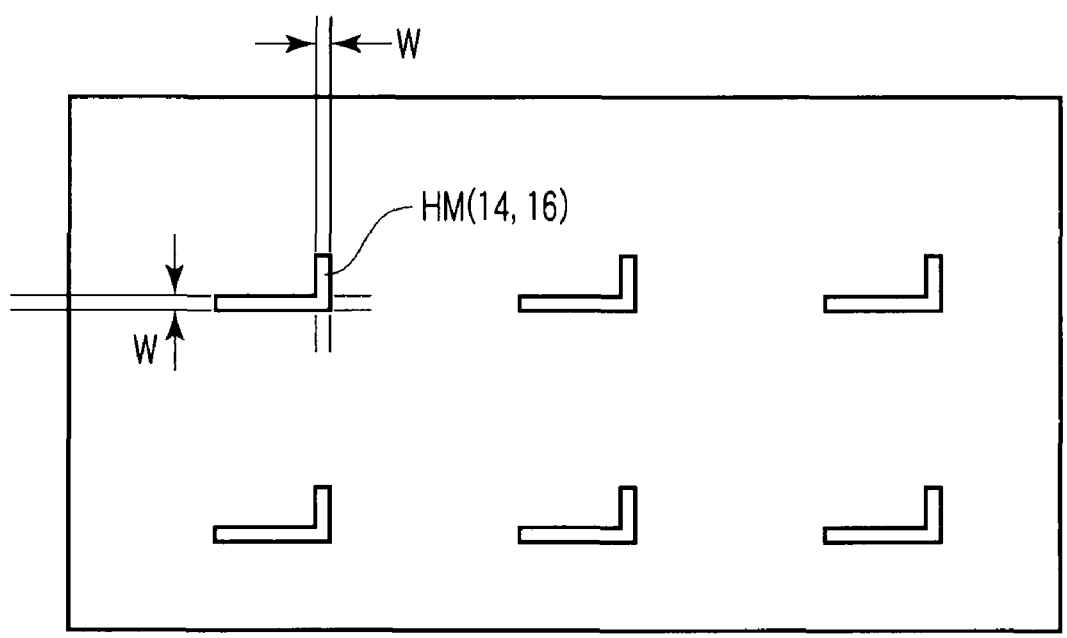
F I G. 32

SEMICONDUCTOR MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2007-069169, filed Mar. 16, 2007, the entire contents of which are incorporated herein by reference.

BACKGROUND OF THE INVENTION

1. Field of the Invention

The present invention relates to a semiconductor memory device having a resistance change element, and a method of manufacturing the same.

2. Description of the Related Art

In the conventional processing techniques, the feature size strongly depends on the resolution of an exposure apparatus. Accordingly, the performance of an exposure apparatus largely limits the reduction in area of a memory cell and the progress of downsizing and integration of a chip.

Note that pieces of prior art reference information related to the present invention are as follows.

[Patent Reference 1] Jpn. Pat. Appln. KOKAI Publication No. 2006-156657
[Patent Reference 2] Jpn. Pat. Appln. KOKAI Publication No. 2001-156283
[Patent Reference 3] Jpn. Pat. Appln. KOKAI Publication No. 7-263677
[Patent Reference 4] Jpn. Pat. Appln. KOKAI Publication No. 6-077180
[Patent Reference 5] Jpn. Pat. Appln. KOKAI Publication No. 5-198817

BRIEF SUMMARY OF THE INVENTION

A semiconductor memory device according to the first aspect of the present invention comprising a first resistance change element having a first portion and a second portion, the first portion and the second portion having a first space in a first direction; and a second resistance change element formed to have a distance to the first resistance change element in the first direction, and having a third portion and a fourth portion, the third portion and the fourth portion having a second space in the first direction, and the first space and the second space being shorter than the distance.

A semiconductor memory device according to the second aspect of the present invention comprising a first resistance change element; a second resistance change element formed apart from the first resistance change element in a first direction; a first contact connected to the first resistance change element and having a first portion and a second portion, the first portion and the second portion having a first space in the first direction; and a second contact connected to the second resistance change element, formed to have a distance to the first contact in the first direction, and having a third portion and a fourth portion, the third portion and the fourth portion having a second space in the first direction, and the first space and the second space being shorter than the distance.

A semiconductor memory device manufacturing method according to the third aspect of the present invention comprising forming a first insulating film made of a first material on a resistance change film; forming a second insulating film made of a second material on the first insulating film; forming a third insulating film made of the first material on only side surfaces of the second insulating film; depositing a fourth insulating film made of the second material around the third insulating film and on the second insulating film; exposing the second insulating film and the third insulating film by planarizing the fourth insulating film; removing the first insulating film, the second insulating film, and the fourth insulating film from a region not covered with the third insulating film, thereby forming a mask including the first insulating film and the third insulating film on the resistance change film; and removing the resistance change film by using the mask, thereby forming a resistance change element for each memory cell.

BRIEF DESCRIPTION OF THE SEVERAL VIEWS OF THE DRAWING

FIG. 5A is a plan view showing a manufacturing step, which follows FIG. 4, of the magnetic random access memory according to the first embodiment of the present invention;

FIG. 5B is a sectional view taken along a line VB-VB in FIG. 5A;

FIG. 5C is a sectional view taken along a line VC-VC in FIG. 5A;

FIG. 7A is a partially enlarged view of FIG. 6A;

FIG. 7B is a sectional view taken along a line VIIB-VIIB in FIG. 7A;

FIG. 7C is a sectional view taken along a line VIIC-VIIC in FIG. 7A;

FIG. 7D is a sectional view taken along a line VIID-VIID in FIG. 7A;

FIG. 7E is a sectional view taken along a line VIIE-VIIE in FIG. 7A;

FIG. 12A is a plan view showing a manufacturing step of the magnetic random access memory according to the third embodiment of the present invention;

FIG. 12B is a sectional view taken along a line XIIB-XIIB in FIG. 12A;

FIG. 12C is a sectional view taken along a line XIIC-XIIC in FIG. 12A;

FIG. 18A is a plan view showing a manufacturing step, which follows FIG. 17, of the magnetic random access memory according to the fourth embodiment of the present invention;

FIG. 18B is a sectional view taken along a line XVIIIB-XVIIIB in FIG. 18A;

FIG. 23A is a plan view showing a manufacturing step, which follows FIG. 22, of the magnetic random access memory according to the fifth embodiment of the present invention;

FIG. 23B is a sectional view taken along a line XXIIIB-XXIIIB in FIG. 23A;

FIG. 24 is a plan view showing a magnetic random access memory according to the sixth embodiment of the present invention;

FIG. 27 is a plan view showing a manufacturing step, which follows FIG. 25, of the magnetic random access memory according to the sixth embodiment of the present invention;

FIG. 28 is a plan view showing a manufacturing step, which follows FIG. 27, of the magnetic random access memory according to the sixth embodiment of the present invention;

FIG. 29 is a plan view showing a magnetic random access memory according to the seventh embodiment of the present invention;

FIG. 30 is a plan view showing a manufacturing step of the magnetic random access memory according to the seventh embodiment of the present invention;

FIG. 31 is a plan view showing a manufacturing step, which follows FIG. 30, of the magnetic random access memory according to the seventh embodiment of the present invention; and FIG. 32 is a plan view showing a manufacturing step, which follows FIG. 31, of the magnetic random access memory according to the seventh embodiment of the present invention.

DETAILED DESCRIPTION OF THE INVENTION

Figure 1A:
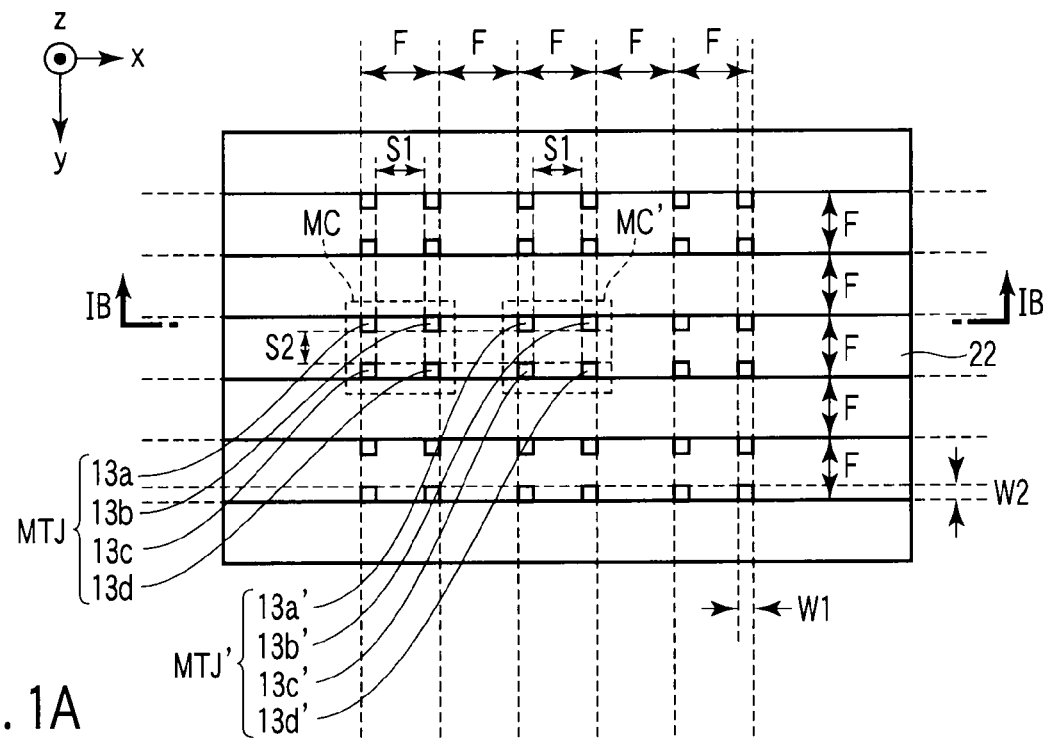
FIG. 1A is a plan view showing a magnetic random access memory according to the first embodiment of the present invention.

Embodiments of the present invention will be explained below with reference to the accompanying drawing. In the following explanation, the same reference numerals denote the same parts throughout the drawing.

[1] First Embodiment

The first embodiment is an example of downsizing of a magnetoresistive effect element used as a memory element in a magnetic random access memory (MRAM). An MTJ (Magnetic Tunnel Junction) element will be taken as an example of the magnetoresistive effect element.

[1-1] Structure

Figure 1B:
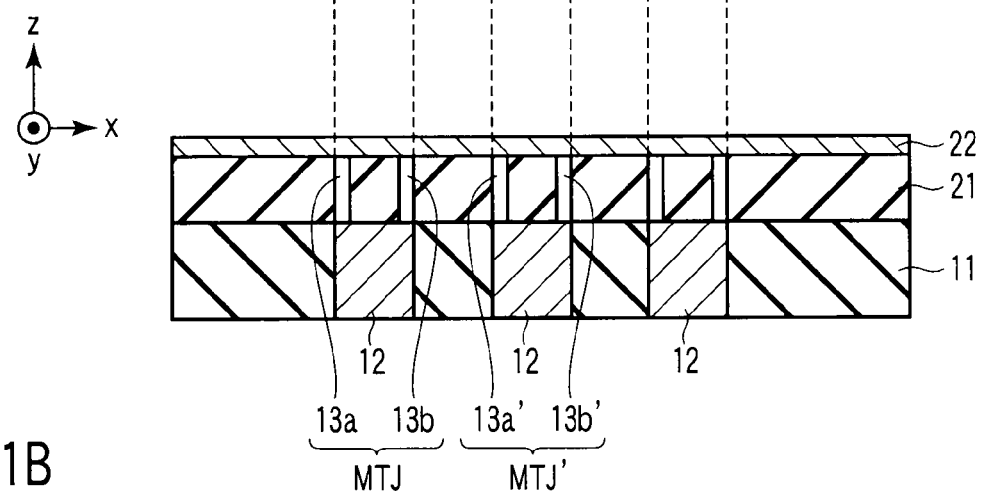
FIG. 1B is a sectional view taken along a line IB-IB in FIG. 1A.

FIG. 1A is a plan view of a magnetic random access memory according to the first embodiment of the present invention. FIG. 1B is a sectional view taken along a line IB-IB in FIG. 1A. A memory cell of the magnetic random access memory according to the first embodiment will be explained below.

As shown in FIGS. 1A and 1B, contacts 12 connecting to transistors (not shown) are formed in an insulating film 11, and MTJ elements MTJ are formed on the contacts 12. The MTJ elements MTJ are surrounded by a silicon oxide film ($SiO_2$ film) 21, and interconnections 22 are formed on the MTJ elements MTJ and silicon oxide film 21. The MTJ element MTJ has the bottom surface connected to the contact 12, and the upper surface connected to the interconnection 22.

Each cell MC has one MTJ element MTJ and one transistor (not shown). The MTJ element MTJ has first, second, third, and fourth portions 13a, 13b, 13c, and 13d. The first, second, third, and fourth portions 13a, 13b, 13c, and 13d are separately arranged at four corners as the apexes of a quadrangle. Although this quadrangle is, e.g., a square, the first, second, third, and fourth portions 13a, 13b, 13c, and 13d may also be slightly shifted from the apexes of the square by misalignment or the like.

The first and second portions 13a and 13b are arranged to have a first space S1 in the X direction. Similarly, the third and fourth portions 13c and 13d are arranged to have the first space S1 in the X direction. The first space S1 is shorter than a distance F between the MTJ element MTJ and an MTJ element MTJ' adjacent to each other in the X direction. The distance F is, e.g., the feature size.

The first and third portions 13a and 13c are arranged to have a second space S2 in the Y direction. Likewise, the second and fourth portions 13b and 13d are arranged to have the second space S2 in the Y direction. The second space S2 is shorter than a distance F between MTJ elements adjacent to each other in the Y direction. The distance F is, e.g., the feature size.

Although the first and second spaces S1 and S2 described above are equal in this embodiment, they may also be different.

The planar shapes of the first, second, third, and fourth portions 13a, 13b, 13c, and 13d are, e.g., squares, and the areas of these squares are, e.g., equal.

Figure 2A:
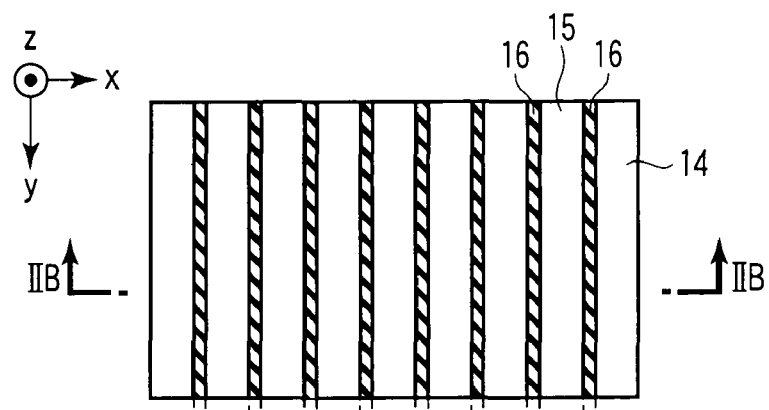
FIG. 2A is a plan view showing a manufacturing step of the magnetic random access memory according to the first embodiment of the present invention.
Figure 2B:
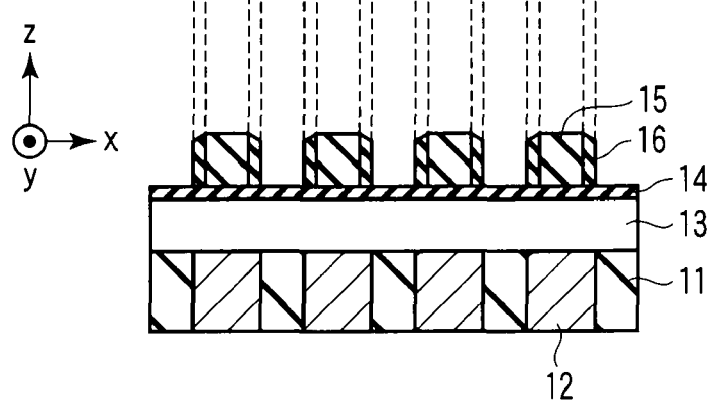
FIG. 2B is a sectional view taken along a line IIB-IIB in FIG. 2A.

A width W1 in the X direction of each of the first, second, third, and fourth portions 13a, 13b, 13c, and 13d is smaller than any of the first and second spaces S1 and S2 and distance F described above. The width W1 is determined by the sidewall film thickness of a silicon nitride film (SiN film) 16 serving as a part of a hard mask HM when processing the MTJ element MTJ (FIGS. 2A and 2B).

A width W2 in the Y direction of each of the first, second, third, and fourth portions 13a, 13b, 13c, and 13d is smaller than any of the first and second spaces S1 and S2 and distance F described above. The width W2 is determined by the sidewall film thickness of a silicon nitride film 20 serving as a part of the hard mask HM when processing the MTJ element MTJ (FIGS. 5A to 5C).

[1-2] Manufacturing Method

FIGS. 2A and 2B to FIGS. 9A and 9B are views of the manufacturing steps of the magnetic random access memory according to the first embodiment of the present invention. A method of manufacturing the memory cell of the magnetic random access memory according to the first embodiment will be explained below.

First, as shown in FIGS. 2A and 2B, a stacked magnetic film 13 is formed on an insulating film 11 and contacts 12. A silicon nitride film 14 as a silicon oxide film etching stopper is deposited on the stacked magnetic film 13, and a silicon oxide film 15 is deposited on the silicon nitride film 14. Then, a line-and-space pattern of the silicon oxide film 15 is formed by photolithography and RIE (Reactive Ion Etching). A silicon nitride film 16 is deposited on the line-and-space silicon oxide film 15 and the silicon nitride film 14. Subsequently, the silicon nitride film 16 is partially removed by highly perpendicular anisotropic etching (e.g., RIE). Consequently, the silicon nitride film 16 is left behind on only the sidewalls of the silicon oxide film 15.

Figure 3:
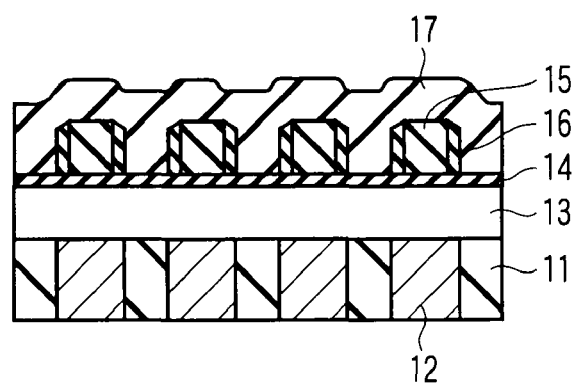
FIG. 3 is a sectional view showing a manufacturing step, which follows FIG. 2B, of the magnetic random access memory according to the first embodiment of the present invention.

Next, as shown in FIG. 3, a silicon oxide film 17 is deposited with high gap filling capability on the silicon nitride films 14 and 16 and silicon oxide film 15.

Figure 4:
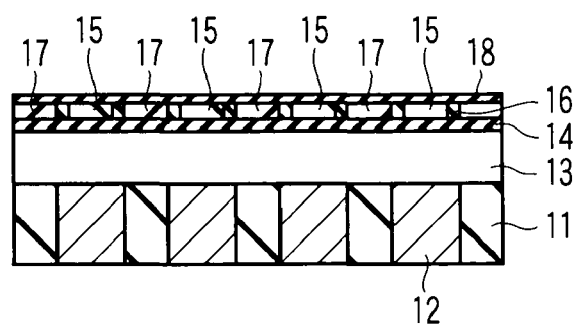
FIG. 4 is a sectional view showing a manufacturing step, which follows FIG. 3, of the magnetic random access memory according to the first embodiment of the present invention.

As shown in FIG. 4, non-masking etch back is performed on the structure shown in FIG. 3 by CMP (Chemical Mechanical Polish) or RIE. This process removes the sloping shoulders of the silicon nitride film 16 deposited on the silicon oxide film 15, and forms flat lines of the silicon oxide films 15 and 17 and silicon nitride film 16. After that, a silicon nitride film 18 as a stopper is deposited on the silicon oxide films 15 and 17 and silicon nitride film 16.

As shown in FIGS. 5A to 5C, a silicon oxide film 19 is deposited on the silicon nitride film 18. Then, a line-and-space pattern of the silicon oxide film 19 is formed by photolithography and RIE. This line-and-space pattern shown in FIG. 5A extends in a direction (the X direction) rotated 90° from the direction of the line-and-space pattern shown in FIG. 2A. Subsequently, a silicon nitride film 20 is deposited on the line-and-space silicon oxide film 19 and the silicon nitride film 18. The silicon nitride film 20 is partially removed by highly perpendicular anisotropic etching (e.g., RIE). Consequently, the silicon nitride film 20 is left behind on only the sidewalls of the silicon oxide film 19.

Figures 6A, 6B, 6C:
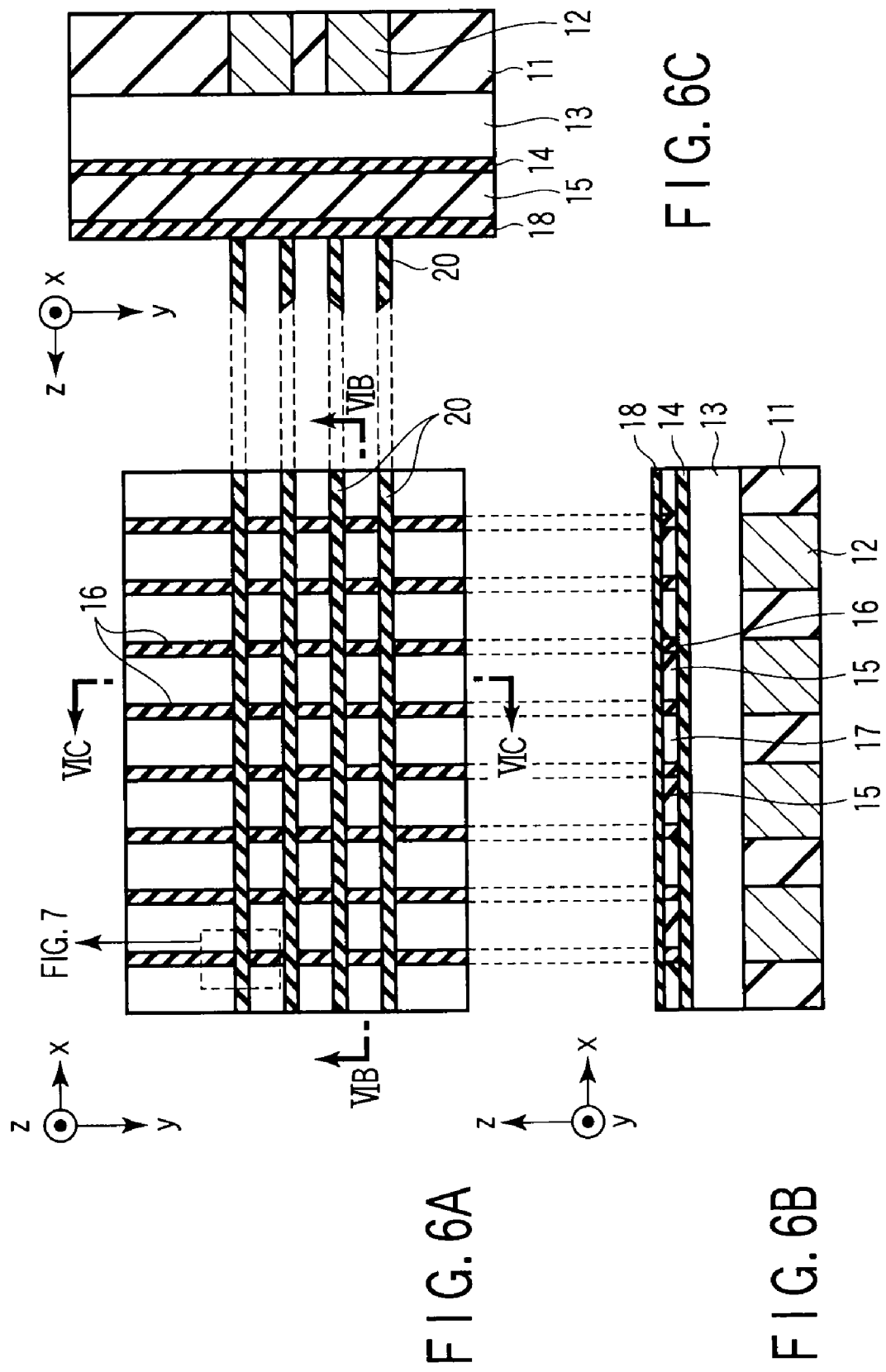
FIG. 6A is a plan view showing a manufacturing step, which follows FIG. 5A, of the magnetic random access memory according to the first embodiment of the present invention.
FIG. 6B is a sectional view taken along a line VIB-VIB in FIG. 6A.
FIG. 6C is a sectional view taken along a line VIC-VIC in FIG. 6A.

As shown in FIGS. 6A to 6C, the silicon oxide film 19 is removed by, e.g., RIE or a liquid chemical.

In this state, in the VIIB-VIIB section of FIG. 7A, as shown in FIG. 7B, the silicon nitride film 14/silicon nitride film 16/silicon nitride film 18/silicon nitride film 20 are deposited on the stacked magnetic film 13.

In the VIIC-VIIC section of FIG. 7A, as shown in FIG. 7C, the silicon nitride film 14/silicon nitride film 16/silicon nitride film 18 are deposited on the stacked magnetic film 13.

In the VIID-VIID section of FIG. 7A, as shown in FIG. 7D, the silicon nitride film 14/silicon nitride film 16/silicon nitride film 18/silicon nitride film 20 are deposited on the stacked magnetic film 13.

In the VIIE-VIIE section of FIG. 7A, as shown in FIG. 7E, the silicon nitride film 14/silicon oxide film 15/silicon nitride film 18/silicon nitride film 20 are deposited on the stacked magnetic film 13.

Accordingly, only the silicon nitride films 14, 16, 18, and 20 are deposited on the stacked magnetic film 13 in a region where the silicon nitride films 16 and 20 intersect each other.

Figure 8A:
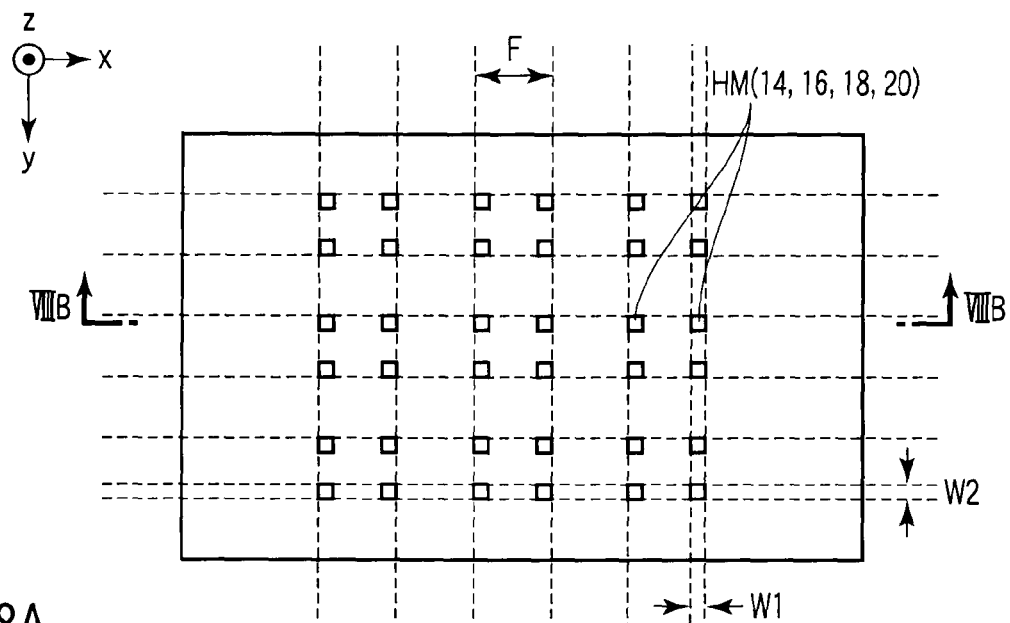
FIG. 8A is a sectional view showing a manufacturing step, which follows FIG. 6A, of the magnetic random access memory according to the first embodiment of the present invention.
Figure 8B:
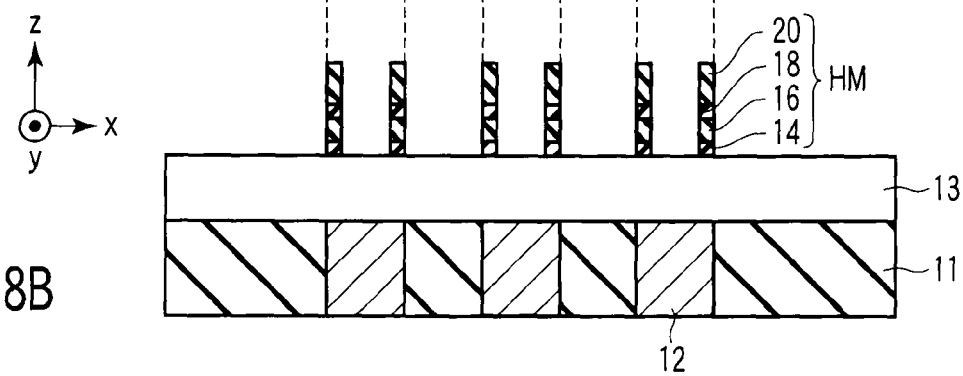
FIG. 8B is a sectional view taken along a line VIIIB-VIIIB in FIG. 8A.

Then, as shown in FIGS. 8A and 8B, RIE is performed under the conditions that the etching rate of a silicon oxide film is higher than that of a silicon nitride film. Consequently, a hard mask HM including only the silicon nitride films 14, 16, 18, and 20 is formed on the stacked magnetic film 13.

The silicon nitride films 16 and 20 determine the dimensions of the hard mask HM including the silicon nitride films 14, 16, 18, and 20. It is possible to control a width W1 in the X direction of the hard mask HM by the deposited film thickness of the silicon nitride film 16, and a width W2 in the Y direction of the hard mask HM by the deposited film thickness of the silicon nitride film 20. Accordingly, the dimensions of the hard mask HM including the silicon nitride films 14, 16, 18, and 20 can be freely designed independently of the resolution of an exposure apparatus.

Figure 9A:
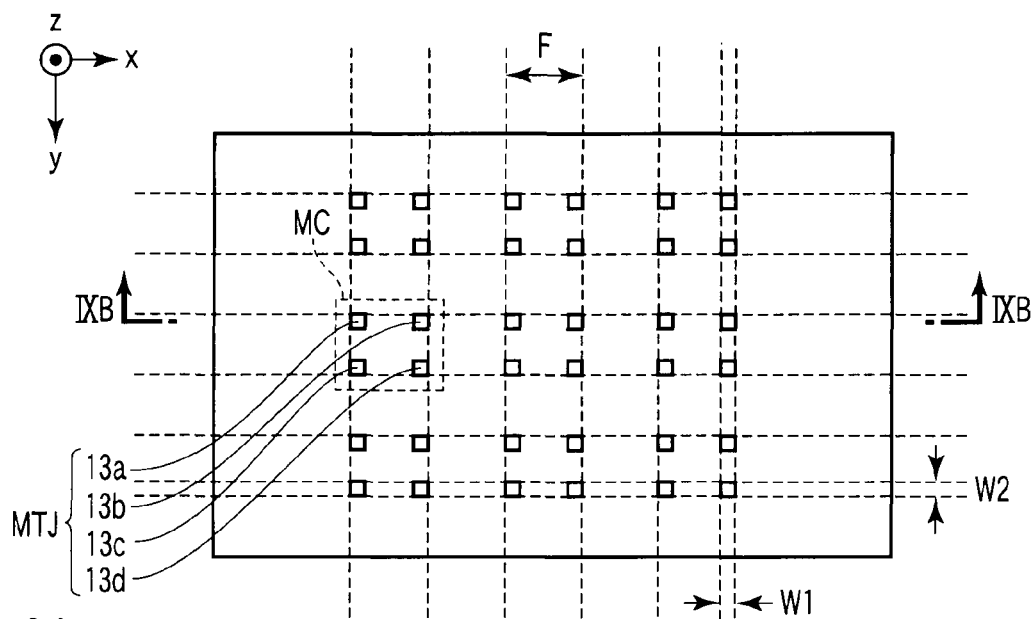
FIG. 9A is a plan view showing a manufacturing step, which follows FIG. 8A, of the magnetic random access memory according to the first embodiment of the present invention.
Figure 9B:
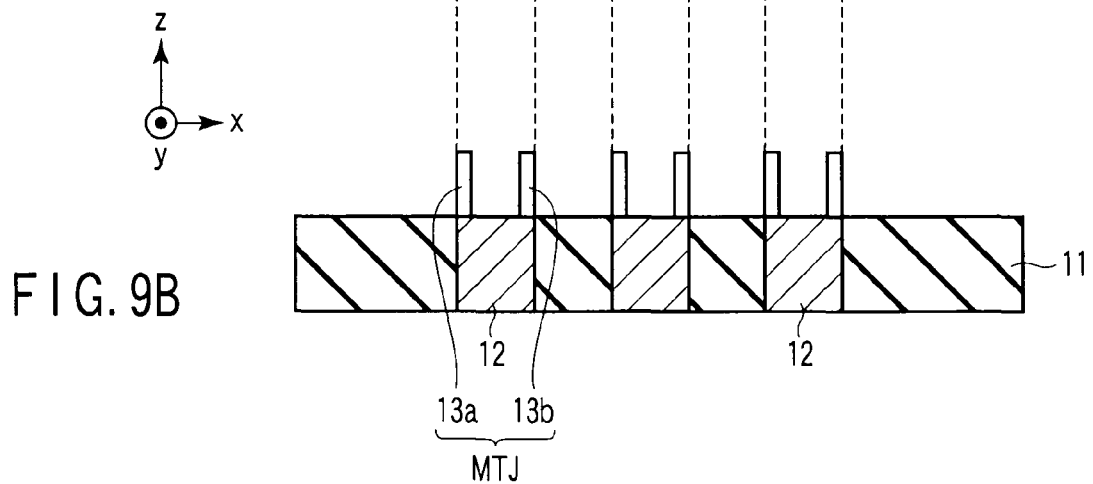
FIG. 9B is a sectional view taken along a line IXB-IXB in FIG. 9A.

As shown in FIGS. 9A and 9B, the hard mask HM is used to etch the stacked magnetic film 13 by ion milling or RIE, thereby forming an MTJ element MTJ having first, second, third, and fourth portions 13a, 13b, 13c, and 13d in a cell MC.

Subsequently, as shown in FIGS. 1A and 1B, a silicon oxide film 21 having high gap filling capability is deposited between the MTJ elements MTJ and etched back by RIE, thereby partially exposing the MTJ elements MTJ. After that, a metal material such as aluminum is deposited on the MTJ elements MTJ and silicon oxide film 21, and interconnections 22 are formed by RIE.

Note that in this embodiment, a silicon nitride film is selected as the material of the hard mask HM, and a silicon oxide film as a material having a high selectivity to this silicon nitride film is used. However, the present invention is not limited to this combination, and materials having a high selectivity can also be selected. Examples of the first material indicated by reference numerals 14, 16, 18, and 20 forming the hard mask HM and the second material indicated by reference numerals 15, 17, and 19 are Si, SiO, SiN, and Ta. It is favorable to combine any of these materials such that the etching rate of the second material is higher than that of the first material, and adjust the conditions of RIE. It is also possible to select the same material as the first and second materials. In this case, the etching rates are adjusted by the RIE conditions.

[1-3] Effects

In the first embodiment described above, the MTJ element MTJ having the first, second, third, and fourth portions 13a, 13b, 13c, and 13d is formed in the cell MC. The widths W1 and W2 of each of the first, second, third, and fourth portions 13a, 13b, 13c, and 13d are determined by the deposited film thicknesses of the silicon nitride films 16 and 20 as parts of the hard mask HM to be used when processing the MTJ element MTJ. Accordingly, the dimensions of the MTJ element MTJ can be freely determined by controlling the film thicknesses of the silicon nitride films 16 and 20 independently of the resolution of an exposure apparatus. Since the MTJ element MTJ can be downsized, therefore, the memory cell can also be downsized.

[2] Second Embodiment

The second embodiment adopts the manufacturing method of the first embodiment for a contact on an MTJ element. Note that an explanation of the same features as in the first embodiment will be omitted in this embodiment.

[2-1] Structure

Figure 10A:
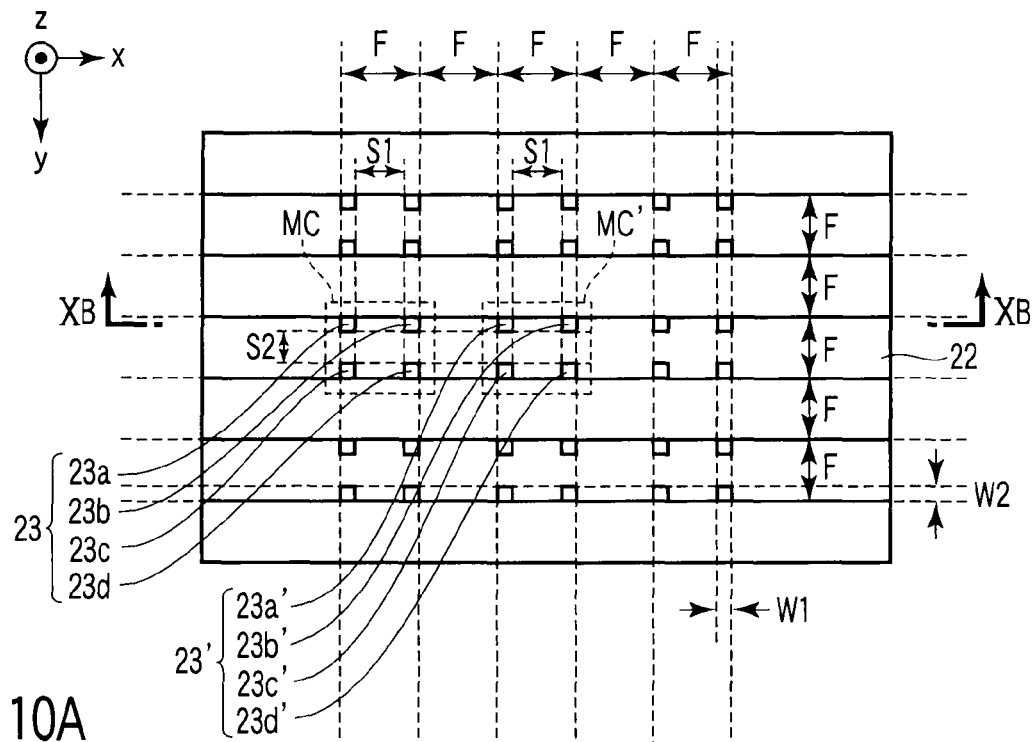
FIG. 10A is a plan view showing a magnetic random access memory according to the second embodiment of the present invention.
Figure 10B:
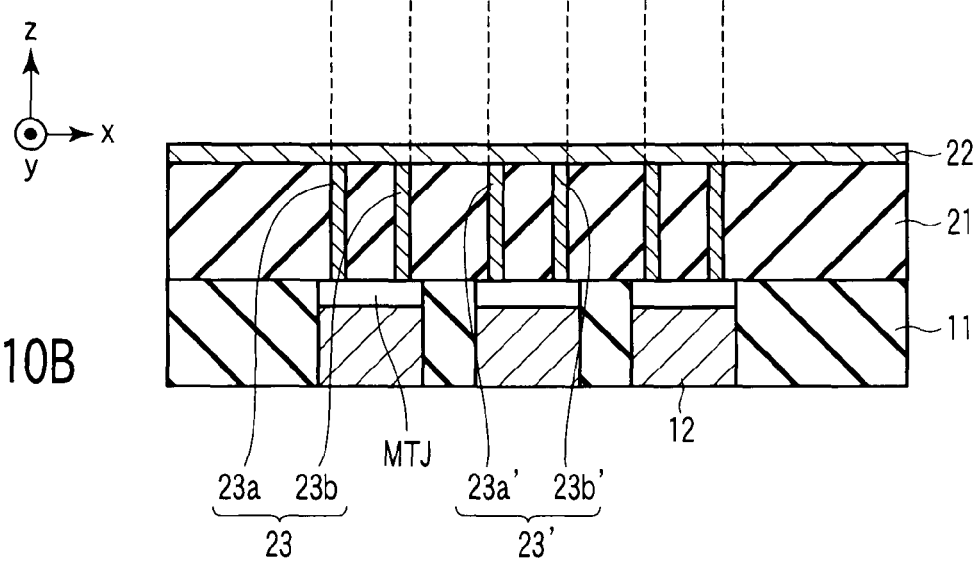
FIG. 10B is a sectional view taken along a line XB-XB in FIG. 10A.

FIG. 10A is a plan view of a magnetic random access memory according to the second embodiment of the present invention. FIG. 10B is a sectional view taken along a line XB-XB in FIG. 10A. A memory cell of the magnetic random access memory according to the second embodiment will be explained below.

In the second embodiment as shown in FIGS. 10A and 10B, a contact 23 on an MTJ element MTJ has the same structure as that of the MTJ element MTJ in the first embodiment.

That is, the contact 23 in one cell has first, second, third, and fourth portions 23a, 23b, 23c, and 23d. The first, second, third, and fourth portions 23a, 23b, 23c, and 23d are separately arranged at four corners as the apexes of a quadrangle (in this embodiment, a square).

The first and second portions 23a and 23b are arranged to have a first space S1 in the X direction. Similarly, the third and fourth portions 23c and 23d are arranged to have the first space S1 in the X direction. The first space S1 is shorter than a distance F between the contact 23 and a contact 23' adjacent to each other in the X direction. The distance F is, e.g., the feature size.

The first and third portions 23a and 23c are arranged to have a second space S2 in the Y direction. Likewise, the second and fourth portions 23b and 23d are arranged to have the second space S2 in the Y direction. The second space S2 is shorter than a distance F between contacts adjacent to each other in the Y direction. The distance F is, e.g., the feature size.

Although the first and second spaces S1 and S2 are equal in this embodiment, they may also be different.

The planar shapes of the first, second, third, and fourth portions 23a, 23b, 23c, and 23d are, e.g., squares, and the areas of these squares are, e.g., equal.

A width W1 in the X direction of each of the first, second, third, and fourth portions 23a, 23b, 23c, and 23d is smaller than any of the first and second spaces S1 and S2 and distance F described above. The width W1 is determined by the sidewall film thickness of a silicon nitride film 16 serving as a part of a hard mask HM when processing the contact 23 (FIGS. 2A and 2B).

A width W2 in the Y direction of each of the first, second, third, and fourth portions 23a, 23b, 23c, and 23d is smaller than any of the first and second spaces S1 and S2 and distance F described above. The width W2 is determined by the sidewall film thickness of a silicon nitride film 20 serving as a part of the hard mask HM when processing the contact 23 (FIGS. 5A to 5C).

[2-2] Manufacturing Method

A method of manufacturing the magnetic random access memory according to the second embodiment is performed for the contact on the MTJ element by the same steps as in the first embodiment.

First, a contact material such as tungsten is deposited on the MTJ element MTJ. Then, a silicon nitride film 14 is deposited on the contact material, and a silicon oxide film 15 is deposited on the silicon nitride film 14. Subsequently, a line-and-space pattern of the silicon oxide film 15 is formed by photolithography and RIE.

After that, a hard mask HM including the silicon nitride film 14 and silicon nitride films 16, 18 and 20 is formed in the same manner as in the first embodiment.

Next, as shown in FIGS. 10A and 10B, the hard mask HM is used to etch the contact material by RIE, thereby forming micropatterned contacts 23. A silicon oxide film 21 having high gap filling capability is deposited between the contacts 23 and etched back by RIE, thereby partially exposing the contacts 23. After that, a metal such as aluminum is deposited on the contacts 23 and silicon oxide film 21, and interconnections 22 are formed by RIE.

[2-3] Effects

In the second embodiment described above, the contact 23 having the first, second, third, and fourth portions 23a, 23b, 23c, and 23d is formed in a cell MC. The widths W1 and W2 of each of the first, second, third, and fourth portions 23a, 23b, 23c, and 23d are determined by the deposited film thicknesses of the silicon nitride films 16 and 20 as parts of the hard mask HM to be used when processing the contact 23. Accordingly, the dimensions of the contact 23 can be freely determined by controlling the film thicknesses of the silicon nitride films 16 and 20 independently of the resolution of an exposure apparatus. Since the contact 23 can be downsized, therefore, the memory cell can also be downsized.

In addition, in the second embodiment, a plurality of separated parts of the contact 23 are connected to one MTJ element MTJ. Therefore, the contact area between the MTJ element MTJ and contact 23 can be reduced. This makes it possible to use the domain wall displacement of the magnetization reversing mechanism of a spin injection type magnetic memory. Consequently, magnetization reversal of the whole MTJ element MTJ can be induced from local magnetization reversal in a region where the contact 23 and MTJ element MTJ are in contact with each other.

[3] Third Embodiment

While fine dot-like MTJ elements are formed in the first embodiment, fine linear MTJ elements are formed in the third embodiment. Note that an explanation of the same features as in the first embodiment will be omitted in this embodiment.

[3-1] Structure

Figures 11A, 11B:
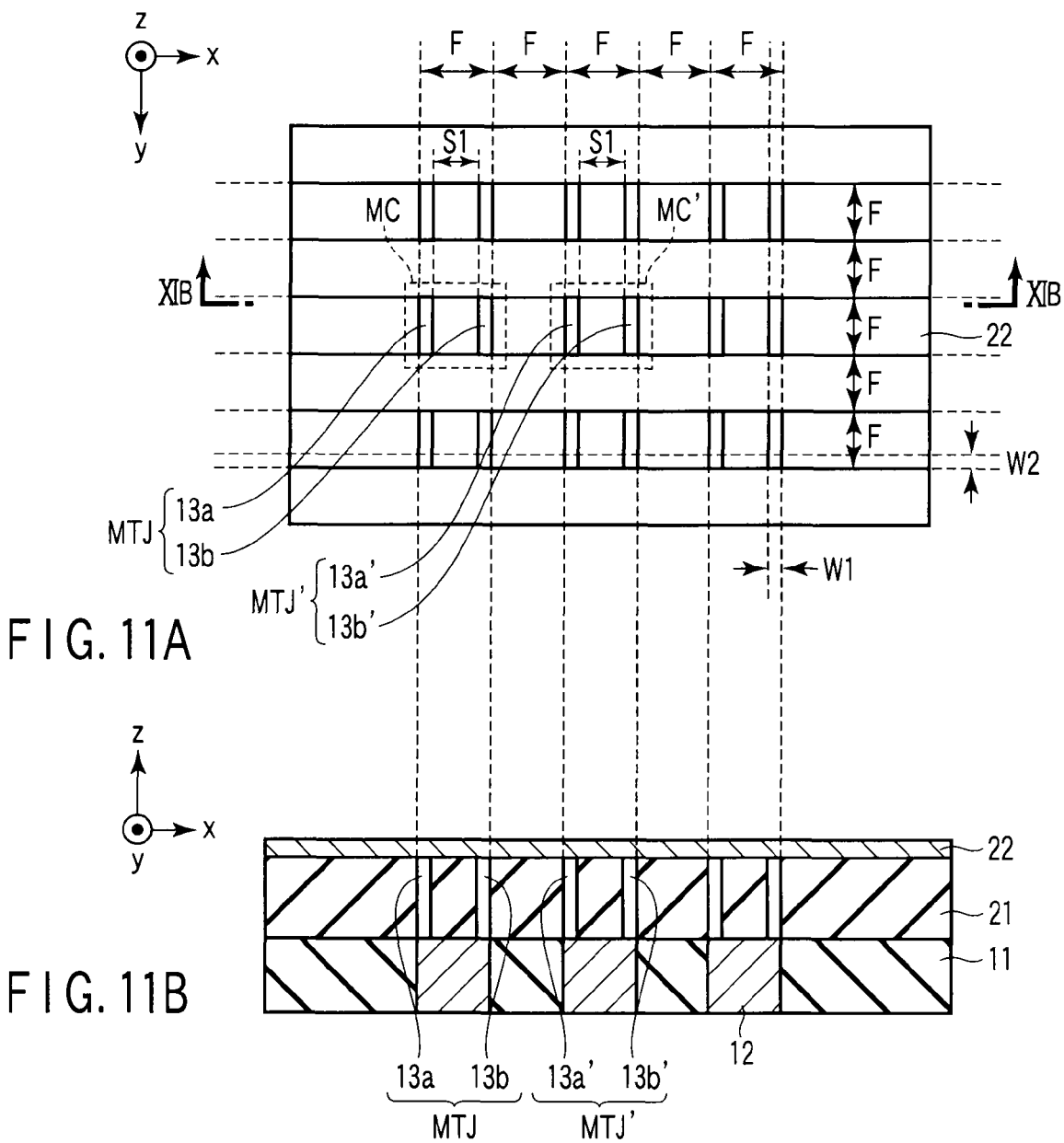
FIG. 11A is a plan view showing a magnetic random access memory according to the third embodiment of the present invention.
FIG. 11B is a sectional view taken along a line XIB-XIB in FIG. 11A.

FIG. 11A is a plan view of a magnetic random access memory according to the third embodiment of the present invention. FIG. 11B is a sectional view taken along a line XIB-XIB in FIG. 11A. A memory cell of the magnetic random access memory according to the third embodiment will be explained below.

As shown in FIGS. 11A and 11B, an MTJ element MTJ and transistor (not shown) are formed in a cell MC. The MTJ element MTJ has first and second linear portions.

The first and second portions 13a and 13b are arranged to have a first space S in the X direction. The first space S is shorter than a distance F between the MTJ element MTJ and an MTJ element MTJ' adjacent to each other in the X direction. The distance F is, e.g., the feature size.

The length in the Y direction of each of the first and second portions 13a and 13b is, e.g., equal to the distance F.

The planar shapes of the first and second portions 13a and 13b are, e.g., rectangles, and the areas of these rectangles are, e.g., equal.

A width W1 in the X direction of each of the first and second portions 13a and 13b is smaller than any of the first and second spaces S1 and S2 and distance F described above. The width W1 is determined by the sidewall film thickness of a silicon nitride film 16 serving as a part of a hard mask HM when processing the MTJ element MTJ (FIGS. 2A and 2B).

[3-2] Manufacturing Method

FIGS. 12A, 12B, 13A, and 13B are views of the manufacturing steps of the magnetic random access memory according to the third embodiment of the present invention. A method of manufacturing the memory cell of the magnetic random access memory according to the third embodiment will be explained below.

First, in the same manner as in the first embodiment as shown in FIGS. 2A and 2B to FIG. 4, a line-and-space pattern is obtained by forming a silicon nitride film 16 on the side surfaces of a silicon oxide film 15. A silicon nitride film 18 as a stopper is deposited on this line-and-space pattern.

Then, as shown in FIGS. 12A and 12B, the silicon nitride film 18 is coated with a resist 30, and a line-and-space pattern of the resist 30 is formed by photolithography. This line-and-space pattern shown in FIG. 12A extends in a direction (the Y direction) rotated 90° from the direction of the line-and-space pattern shown in FIG. 2A.

Figure 13A:
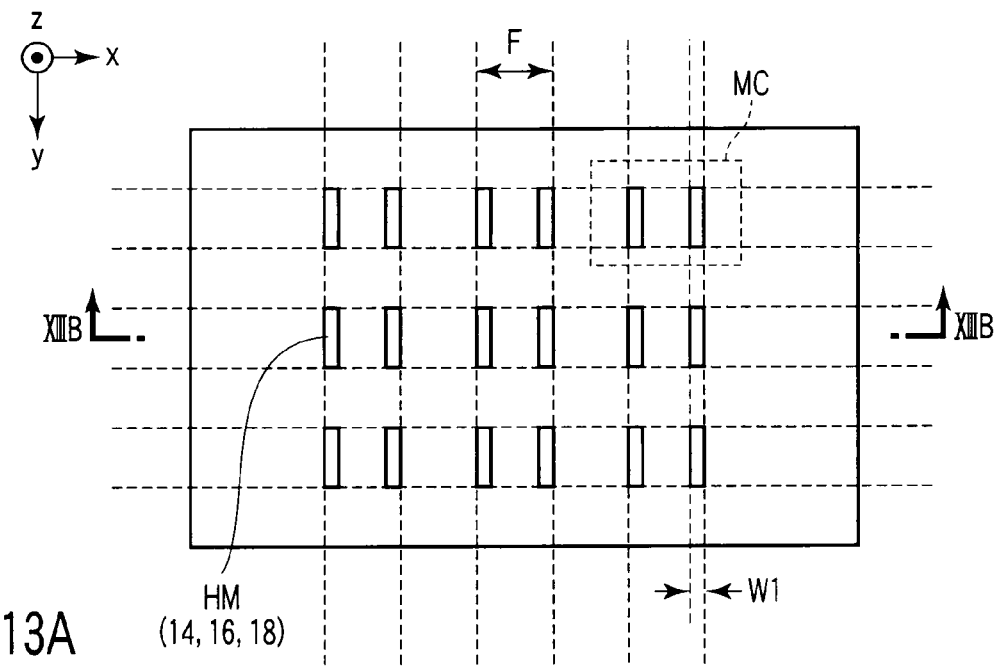
FIG. 13A is a plan view showing a manufacturing step, which follows FIG. 12A, of the magnetic random access memory according to the third embodiment of the present invention.
Figure 13B:
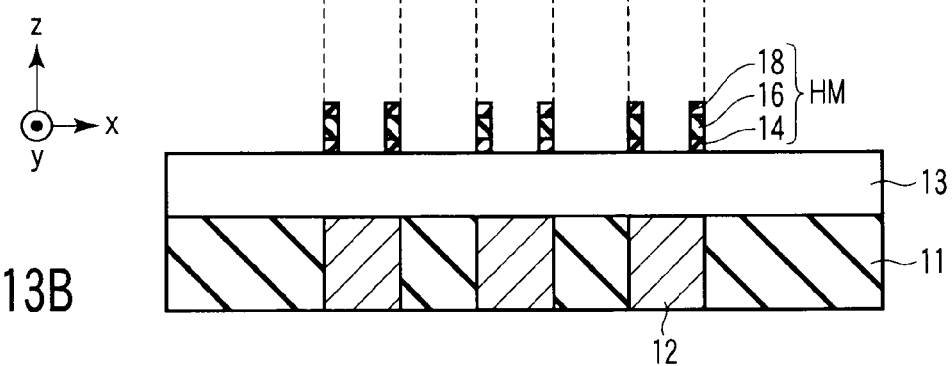
FIG. 13B is a sectional view taken along a line XIIIB-XIIIB in FIG. 13A.

Subsequently, the resist 30 is used to etch the silicon oxide film and silicon nitride films at equal rates by RIE. After that, the resist 30 is removed. In addition, RIE or wet etching is performed to remove only the silicon oxide film. Consequently, as shown in FIGS. 13A and 13B, a hard mask HM including a silicon nitride film 14 and the silicon nitride films 16 and 18 is formed on a stacked magnetic film 13.

The hard mask HM is used to etch the stacked magnetic film 13 by ion milling or RIE, thereby forming MTJ elements MTJ.

Next, as shown in FIGS. 11A and 11B, a silicon oxide film 21 having high gap filling capability is deposited between the MTJ elements MTJ and etched back by RIE, thereby partially exposing the MTJ elements MTJ. After that, a metal material such as aluminum is deposited on the MTJ elements MTJ and silicon oxide film 21, and interconnections 22 are formed by RIE.

[3-3] Effects

In the third embodiment described above, the MTJ element MTJ having the first and second portions 13a and 13b is formed in the cell MC. The width W1 in the X direction of each of the first and second portions 13a and 13b is determined by the deposited film thickness of the silicon nitride film 16 as a part of the hard mask HM to be used when processing the MTJ element MTJ. Accordingly, the dimensions of the MTJ element MTJ can be freely determined by controlling the film thickness of the silicon nitride film 16 independently of the resolution of an exposure apparatus. Since the MTJ element MTJ can be downsized, therefore, the memory cell can also be downsized.

In addition, in the third embodiment, the aspect ratio of the MTJ element MTJ can easily be changed by controlling the film thickness of the silicon nitride film 16.

[4] Fourth Embodiment

The fourth embodiment is an example in which a fine annular (ring-like) MTJ element is formed. Note that an explanation of the same features as in the first embodiment will be omitted in this embodiment.

[4-1] Structure

Figures 14A, 14B:
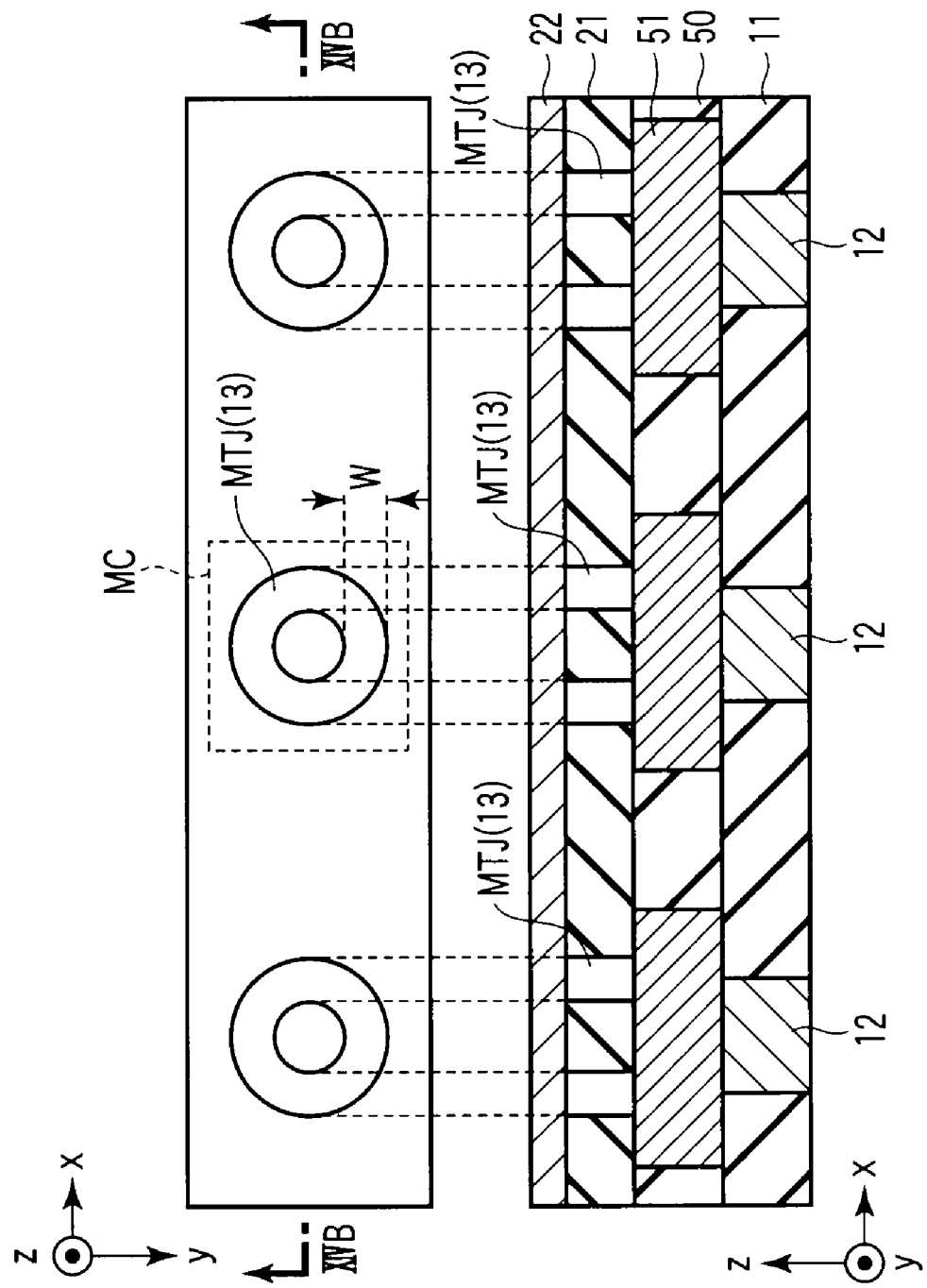
FIG. 14A is a plan view showing a magnetic random access memory according to the fourth embodiment of the present invention.
FIG. 14B is a sectional view taken along a line XIVB-XIVB in FIG. 14A.

FIG. 14A is a plan view of a magnetic random access memory according to the fourth embodiment of the present invention. FIG. 14B is a sectional view taken along a line XIVB-XIVB in FIG. 14A. A memory cell of the magnetic random access memory according to the fourth embodiment will be explained below.

As shown in FIGS. 14A and 14B, contacts 12 connecting to transistors (not shown) are formed in an insulating film 11, and lower electrodes 51 are formed on the contacts 12. The lower electrodes 51 are surrounded by an insulating film 50. Annular MTJ elements MTJ are formed on the lower electrodes 51.

Figure 15A:
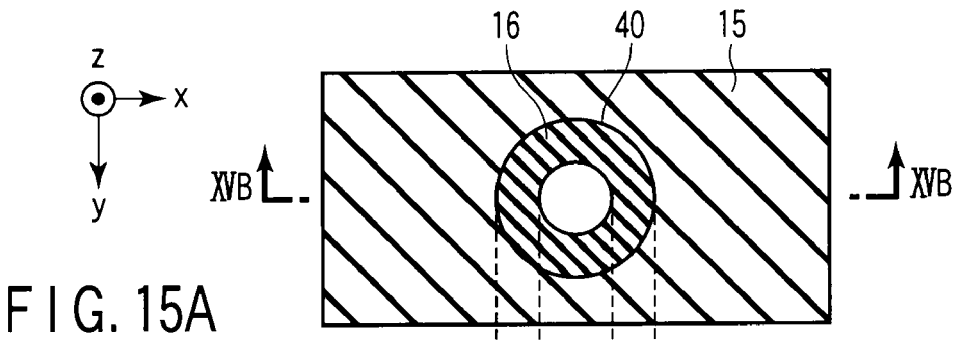
FIG. 15A is a plan view showing a manufacturing step of the magnetic random access memory according to the fourth embodiment of the present invention.
Figure 15B:
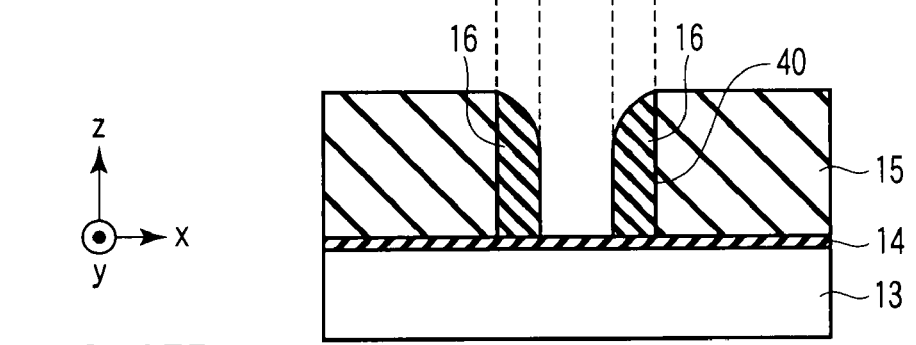
FIG. 15B is a sectional view taken along a line XVB-XVB in FIG. 15A.

A width W of the MTJ element MTJ is determined by the sidewall film thickness of a silicon nitride film 16 serving as a part of a hard mask HM when processing the MTJ element MTJ (FIGS. 15A and 15B). The width W of the MTJ element MTJ is, e.g., smaller than the feature size.

[4-2] Manufacturing Method

FIGS. 15A and 15B to FIGS. 18A and 18B are views of the manufacturing steps of the magnetic random access memory according to the fourth embodiment of the present invention. A method of manufacturing the memory cell of the magnetic random access memory according to the fourth embodiment will be explained below.

First, as shown in FIGS. 15A and 15B, a silicon nitride film 14 as a silicon oxide film etching stopper is deposited on a stacked magnetic film 13, and a silicon oxide film 15 is deposited on the silicon nitride film 14. Then, a trench 40 is formed in the silicon oxide film 15 by photolithography and RIE. A silicon nitride film 16 is deposited on the circumferential surface and bottom surface of the trench 40 and on the silicon oxide film 15. Subsequently, the silicon nitride film 16 is partially removed by highly perpendicular anisotropic etching (e.g., RIE). Consequently, the silicon nitride film 16 is left behind on only the circumferential wall of the trench 40.

Figure 16:
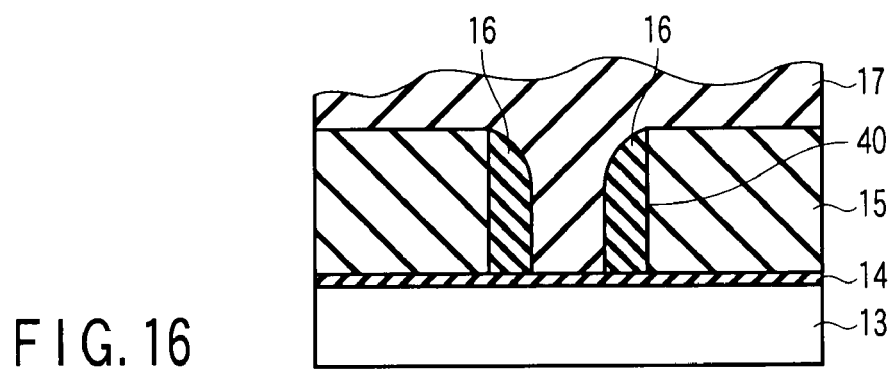
FIG. 16 is a sectional view showing a manufacturing step, which follows FIG. 15B, of the magnetic random access memory according to the fourth embodiment of the present invention.

As shown in FIG. 16, a silicon oxide film 17 is deposited with high gap filling capability on the silicon nitride films 14 and 16 and silicon oxide film 15.

Figure 17:
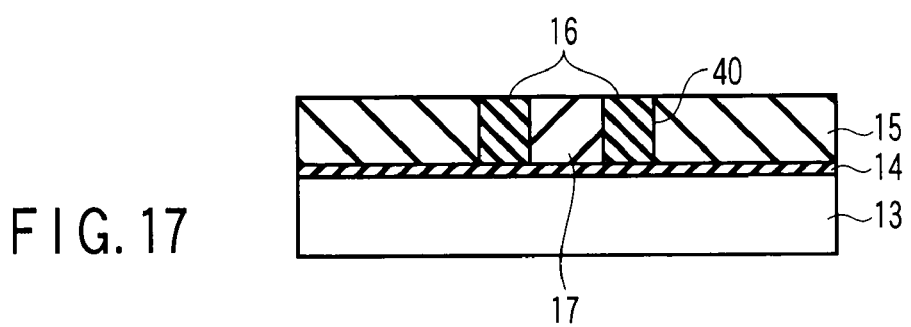
FIG. 17 is a sectional view showing a manufacturing step, which follows FIG. 16, of the magnetic random access memory according to the fourth embodiment of the present invention.

As shown in FIG. 17, non-masking etch back is performed on the structure shown in FIG. 16 by CMP or RIE. This process removes the sloping shoulder of the silicon nitride film 16 and planarizes the upper surface, thereby exposing the silicon nitride film 16 and silicon oxide film 15.

As shown in FIGS. 18A and 18B, the silicon oxide films 15 and 17 of the structure shown in FIG. 17 are removed by RIE or liquid chemical etching under the conditions that the etching rate of a silicon oxide film is higher than that of a silicon nitride film, thereby forming an annular silicon nitride film 16. The silicon nitride film 16 is used as a mask to etch the silicon nitride film 14. Consequently, an annular hard mask HM including the silicon nitride films 14 and 16 is formed.

Next, as shown in FIGS. 14A and 14B, the annular hard mask HM is used to etch a stacked magnetic film 13, thereby forming an annular MTJ element MTJ. Subsequently, a silicon oxide film 21 having high gap filling capability is deposited between the MTJ elements MTJ and etched back by RIE, thereby partially exposing the MTJ elements MTJ. After that, a metal material such as aluminum is deposited on the MTJ elements MTJ and silicon oxide film 21, and interconnections 22 are formed by RIE.

[4-3] Effects

In the fourth embodiment described above, the fine ring-like MTJ element MTJ is formed. The width W of the ring is determined by the deposited film thickness of the silicon nitride film 16 as a part of the hard mask HM to be used when processing the MTJ element MTJ. Accordingly, the dimensions of the MTJ element MTJ can be freely determined by controlling the film thickness of the silicon nitride film 16 independently of the resolution of an exposure apparatus. Since the MTJ element MTJ can be downsized, therefore, the memory cell can also be downsized.

In addition, in the fourth embodiment, the MTJ element MTJ is annular and hence is magnetostatically stable. Accordingly, the MTJ element MTJ is particularly effective in a longitudinal magnetization type (parallel magnetization type) spin injection magnetization reversal magnetic memory.

[5] Fifth Embodiment

The fifth embodiment is an example in which a fine columnar MTJ element is formed. Note that an explanation of the same features as in the first embodiment will be omitted in this embodiment.

[5-1] Structure

Figures 19A, 19B:
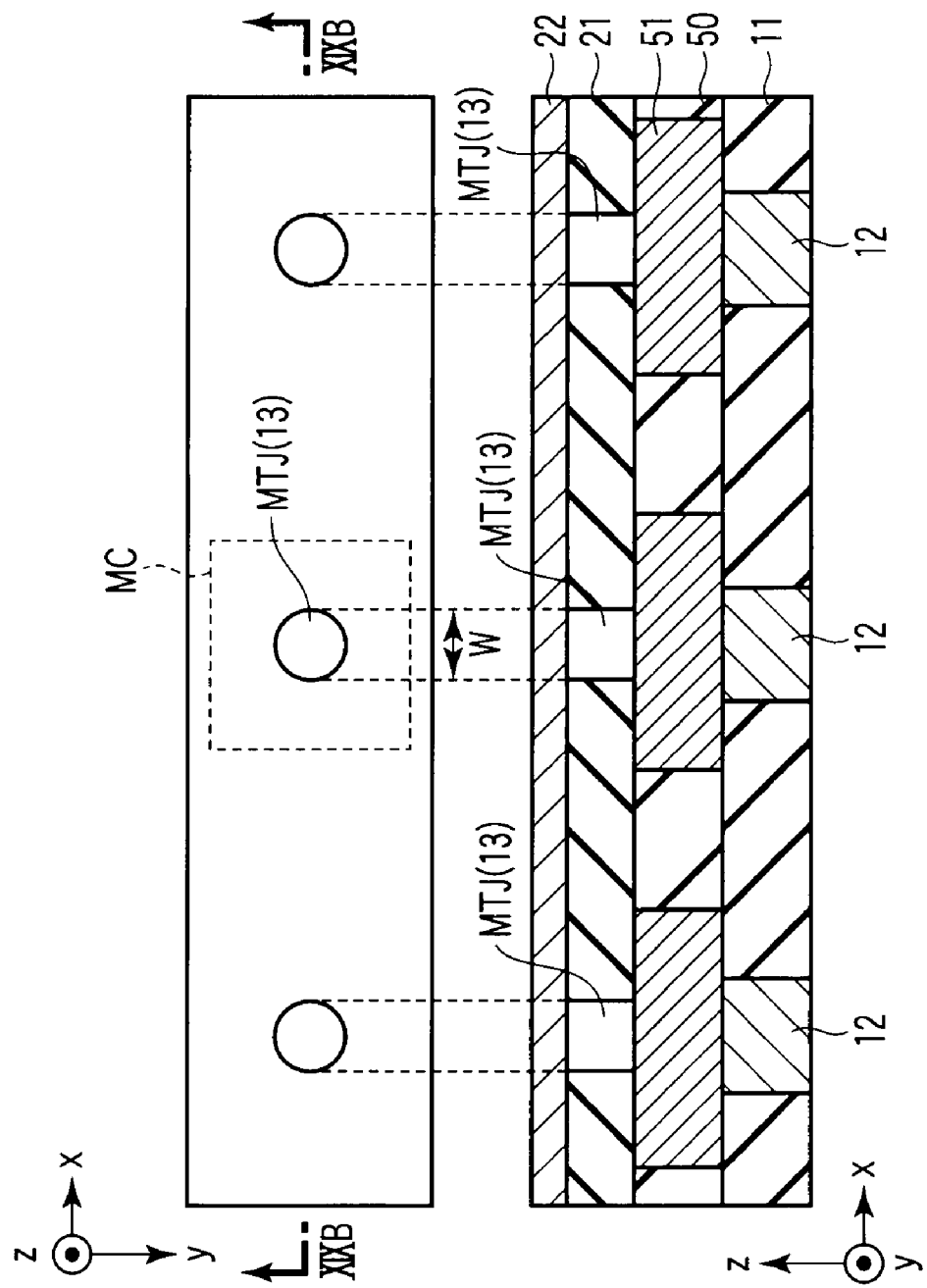
FIG. 19A is a plan view showing a magnetic random access memory according to the fifth embodiment of the present invention.
FIG. 19B is a sectional view taken along a line XIXB-XIXB in FIG. 19A.

FIG. 19A is a plan view of a magnetic random access memory according to the fifth embodiment of the present invention. FIG. 19B is a sectional view taken along a line XIXB-XIXB in FIG. 19A. A memory cell of the magnetic random access memory according to the fifth embodiment will be explained below.

As shown in FIGS. 19A and 19B, contacts 12 connecting to transistors (not shown) are formed in an insulating film 11, and lower electrodes 51 are formed on the contacts 12. The lower electrodes 51 are surrounded by an insulating film 50. Columnar MTJ elements MTJ are formed on the lower electrodes 51.

Figure 20A:
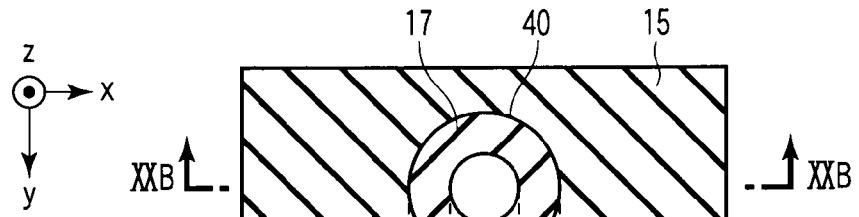
FIG. 20A is a plan view showing a manufacturing step of the magnetic random access memory according to the fifth embodiment of the present invention.
Figure 20B:
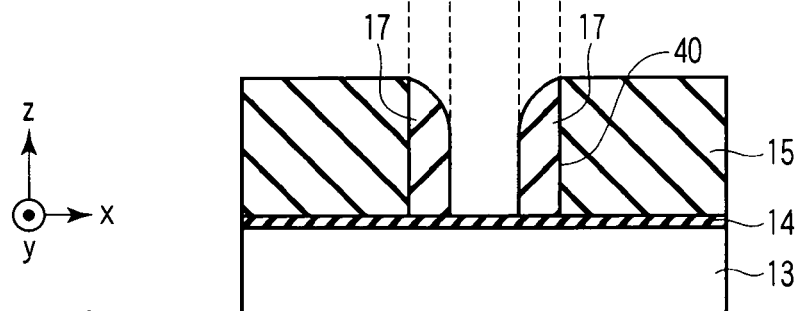
FIG. 20B is a sectional view taken along a line XXB-XXB in FIG. 20A.

A width W of the MTJ element MTJ is determined by the width of a silicon nitride film 16 serving as a part of a hard mask HM when processing the MTJ element MTJ. The width of the silicon nitride film 16 is determined by the sidewall film thickness of a silicon oxide film 17 (FIGS. 20A and 20B). The width W of the MTJ element MTJ is, e.g., smaller than the feature size.

[5-2] Manufacturing Method

FIGS. 20A and 20B to FIGS. 23A and 23B are views of the manufacturing steps of the magnetic random access memory according to the fifth embodiment of the present invention. A method of manufacturing the memory cell of the magnetic random access memory according to the fifth embodiment will be explained below.

First, as shown in FIGS. 20A and 20B, a silicon nitride film 14 as a silicon oxide film etching stopper is deposited on a stacked magnetic film 13, and a silicon oxide film 15 is deposited on the silicon nitride film 14. Then, a trench 40 is formed in the silicon oxide film 15 by photolithography and RIE. A silicon oxide film 17 is deposited on the circumferential surface and bottom surface of the trench 40 and on the silicon oxide film 15. Subsequently, the silicon oxide film 17 is partially removed by highly perpendicular anisotropic etching (e.g., RIE). Consequently, the silicon oxide film 17 is left behind on only the circumferential wall of the trench 40.

Figure 21:
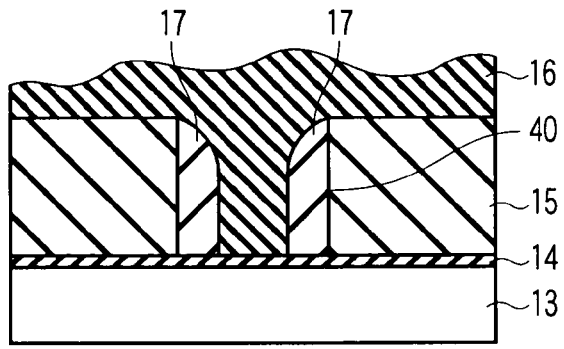
FIG. 21 is a sectional view showing a manufacturing step, which follows FIG. 20B, of the magnetic random access memory according to the fifth embodiment of the present invention.

Next, as shown in FIG. 21, a silicon nitride film 16 is deposited with high gap filling capability on the silicon nitride film 14 and silicon oxide films 15 and 17.

Figure 22:
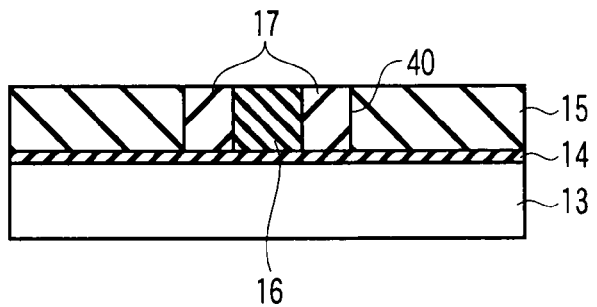
FIG. 22 is a sectional view showing a manufacturing step, which follows FIG. 21, of the magnetic random access memory according to the fifth embodiment of the present invention.

As shown in FIG. 22, non-masking etch back is performed on the structure shown in FIG. 21 by CMP or RIE. This process removes the sloping shoulder of the silicon oxide film 17 and planarizes the upper surface, thereby exposing the silicon oxide films 15 and 17.

As shown in FIGS. 23A and 23B, the silicon oxide films 15 and 17 of the structure shown in FIG. 22 are removed by RIE or liquid chemical etching under the conditions that the etching rate of a silicon oxide film is higher than that of a silicon nitride film, thereby forming a columnar silicon nitride film 16. The silicon nitride film 16 is used as a mask to etch the silicon nitride film 14. Consequently, a columnar hard mask HM including the silicon nitride films 14 and 16 is formed.

Next, as shown in FIGS. 19A and 19B, the columnar hard mask HM is used to etch a stacked magnetic film 13, thereby forming a columnar MTJ element MTJ. Subsequently, a silicon oxide film 21 having high gap filling capability is deposited between the MTJ elements MTJ and etched back by RIE, thereby partially exposing the MTJ elements MTJ. After that, a metal material such as aluminum is deposited on the MTJ elements MTJ and silicon oxide film 21, and interconnections 22 are formed by RIE.

[5-3] Effects

In the fifth embodiment described above, the fine columnar MTJ element MTJ is formed. The width W of the MTJ element MTJ is determined by the width of the silicon nitride film 16 as a part of the hard mask HM to be used when processing the MTJ element MTJ. The width of the silicon nitride film 16 depends upon the deposited film thickness of the silicon oxide film 17 on the circumferential surface of the trench 40. Accordingly, the dimensions of the MTJ element MTJ can be freely determined by controlling the film thickness of the silicon nitride film 17 independently of the resolution of an exposure apparatus. Since the MTJ element MTJ can be downsized, therefore, the memory cell can also be downsized.

[6] Sixth Embodiment

The sixth embodiment is an example in which a fine U-shaped MTJ element is formed. Note that an explanation of the same features as in the first embodiment will be omitted in this embodiment.

[6-1] Structure

FIG. 24 is a plan view of a magnetic random access memory according to the sixth embodiment of the present invention. A memory cell of the magnetic random access memory according to the sixth embodiment will be explained below.

As shown in FIG. 24, U-shaped MTJ elements MTJ connecting to contacts (not shown) are formed in memory cells MC. The length of the bottom surface of the U-shape (the length in the X direction) is desirably larger than the length of the end portion of the U-shape (the length in the Y direction). This is so in order to stabilize the magnetization direction of the MTJ element MTJ in the X direction. Also, the distance between the inner side surfaces of the two end portions of the U-shape is, e.g., a feature size F.

Figure 25:
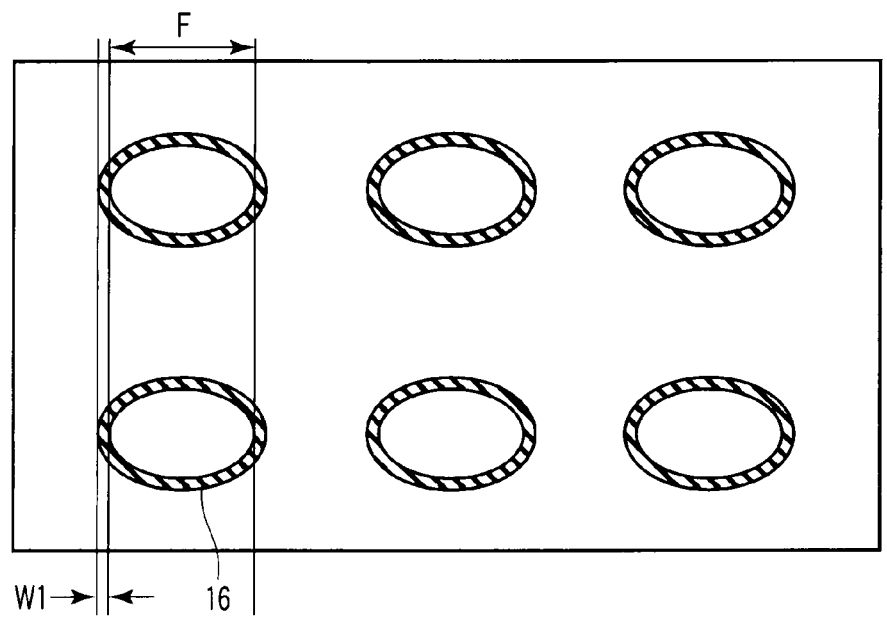
FIG. 25 is a plan view showing a manufacturing step of the magnetic random access memory according to the sixth embodiment of the present invention.
Figure 26A:
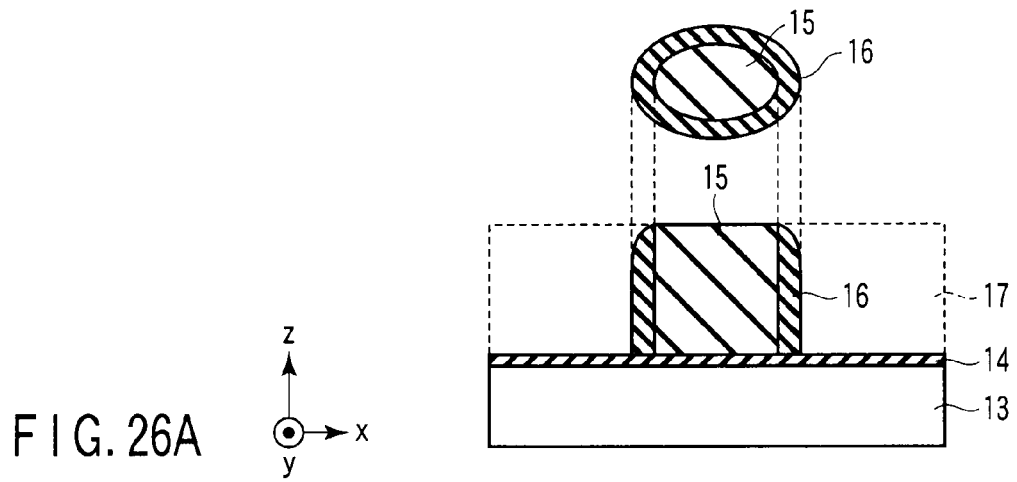
FIG. 26A is a sectional view of the magnetic random access memory, which shows the first method of forming the structure shown in FIG. 25.
Figure 26B:
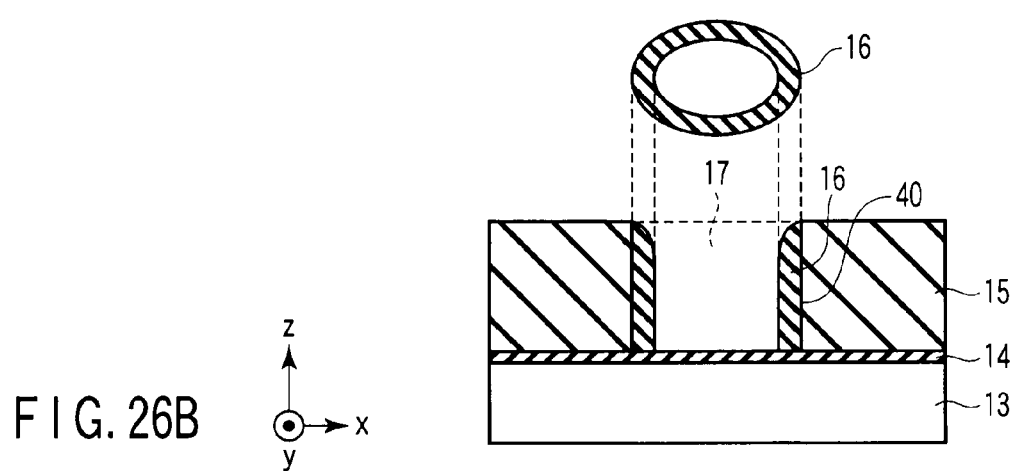
FIG. 26B is a sectional view of the magnetic random access memory, which shows the second method of forming the structure shown in FIG. 25.

A width W of the MTJ element MTJ is determined by the sidewall film thickness of a silicon nitride film 16 serving as a part of a hard mask HM when processing the MTJ element MTJ (FIGS. 25, 26A, and 26B). The width W of the MTJ element MTJ is, e.g., smaller than the feature size F.

[6-2] Manufacturing Method

FIGS. 25 to 28 are views of the manufacturing steps of the magnetic random access memory according to the sixth embodiment of the present invention. A method of manufacturing the memory cell of the magnetic random access memory according to the sixth embodiment will be explained below.

First, as shown in FIG. 25, a silicon nitride film 16 is deposited on the circumferential surface of a silicon oxide film, thereby forming an annular spacer of the silicon nitride film 16. This annular spacer of the silicon nitride film 16 is formed by the various processes explained in the above embodiments.

For example, as shown in FIG. 26A, the silicon nitride film 16 may also be formed on the circumferential surface of a columnar silicon oxide film 15. A practical procedure of the first method is as follows. First, a silicon nitride film 14 is deposited on a stacked magnetic film 13, and a silicon oxide film 15 is deposited on the silicon nitride film 14. Then, an elliptic silicon oxide film 15 is formed by photolithography and RIE. A silicon nitride film 16 is deposited on the silicon oxide film 15 and silicon nitride film 14. Subsequently, the silicon nitride film 16 is partially removed by highly perpendicular anisotropic etching (e.g., RIE). As a consequence, the silicon nitride film 16 is left behind on only the circumferential wall of the silicon oxide film 15. After that, a silicon oxide film 17 is buried around the silicon nitride film 16.

Alternatively, as shown in FIG. 26B, the silicon nitride film 16 may also be formed on the circumferential surface of a trench 40 in the silicon oxide film 15. A practical procedure of the second method is as follows. First, a silicon nitride film 14 is deposited on a stacked magnetic film 13, and a silicon oxide film 15 is deposited on the silicon nitride film 14. Then, a trench 40 is formed in the silicon oxide film 15 by photolithography and RIE. A silicon nitride film 16 is deposited on the circumferential surface and bottom surface of the trench 40 and on the silicon oxide film 15. Subsequently, the silicon nitride film 16 is partially removed by highly perpendicular anisotropic etching (e.g., RIE). As a consequence, the silicon nitride film 16 is left behind on only the circumferential wall of the trench 40. After that, a silicon oxide film 17 is buried in the trench 40.

Next, as shown in FIG. 27, a line-and-space resist 60 is formed by photolithography. The silicon oxide films 15 and 17 and silicon nitride film 16 are removed by RIE from regions not covered with the resist 60. In this process, the silicon oxide films and silicon nitride film are etched at equal rates.

As shown in FIG. 28, the resist 60 is removed. Selective etching of the silicon oxide films 15 and 17 and silicon nitride film 16 is then performed, thereby removing the silicon oxide films 15 and 17. Consequently, a U-shaped silicon nitride film 16 is formed. After that, a U-shaped hard mask HM is formed by processing the silicon nitride film 14 by using the silicon nitride film 16.

Subsequently, as shown in FIG. 24, the stacked magnetic film 13 is etched by using the U-shaped hard mask HM, thereby forming a U-shaped MTJ element MTJ.

The rest is the same as in each of the above embodiments. That is, a silicon oxide film 21 having high gap filling capability is deposited between the MTJ elements MTJ and etched back by RIE, thereby partially exposing the MTJ elements MTJ. After that, a metal material such as aluminum is deposited on the MTJ elements MTJ and silicon oxide film 21, and interconnections 22 are formed by RIE.

[6-3] Effects

In the sixth embodiment described above, the fine U-shaped MTJ element MTJ is formed. The width W of the MTJ element MTJ is determined by the deposited film thickness of the silicon nitride film 16 as a part of the hard mask HM to be used when processing the MTJ element MTJ. Accordingly, the dimensions of the MTJ element MTJ can be freely determined by controlling the film thickness of the silicon nitride film 16 independently of the resolution of an exposure apparatus. Since the MTJ element MTJ can be downsized, therefore, the memory cell can also be downsized.

In addition, the sixth embodiment in which the MTJ element MTJ has a U-shape is particularly effective in a domain wall displacement type magnetic memory.

[7] Seventh Embodiment

The seventh embodiment is an example in which a fine L-shaped MTJ element is formed. Note that an explanation of the same features as in the first embodiment will be omitted in this embodiment.

[7-1] Structure

FIG. 29 is a plan view of a magnetic random access memory according to the seventh embodiment of the present invention. A memory cell of the magnetic random access memory according to the seventh embodiment will be explained below.

As shown in FIG. 29, L-shaped MTJ elements MTJ connecting to contacts (not shown) are formed in memory cells MC. The length in the X direction of the L-shape is desirably larger than that in the Y direction of the L-shape. This is so in order to stabilize the magnetization direction of the MTJ element MTJ along the long side.

A width W of the MTJ element MTJ is determined by the sidewall film thickness of a silicon nitride film 16 serving as a part of a hard mask HM when processing the MTJ element MTJ (FIG. 30). The width W of the MTJ element MTJ is, e.g., smaller than a feature size F.

[7-2] Manufacturing Method

FIGS. 30 to 32 are views of the manufacturing steps of the magnetic random access memory according to the seventh embodiment of the present invention. A method of manufacturing the memory cell of the magnetic random access memory according to the seventh embodiment will be explained below.

First, as shown in FIG. 30, a silicon nitride film 16 is deposited on the side surfaces of a silicon oxide film, thereby forming a spacer of the silicon nitride film 16. This spacer of the silicon nitride film 16 is formed by the various processes explained in the above embodiments.

For example, the silicon nitride film 16 may also be formed on the side surfaces of a silicon oxide film 15. This method is the same as that shown in FIG. 26A. The silicon nitride film 16 may also be formed on the side surfaces of a trench 40 in the silicon oxide film 15. This method is the same as that shown in FIG. 26B.

Then, as shown in FIG. 31, a rectangular resist 60 is formed by photolithography. The silicon oxide film 15 and a silicon oxide film 17 and the silicon nitride film 16 are removed by RIE from regions not covered with the resist 60. In this process, the silicon oxide films and silicon nitride film are etched at equal rates.

As shown in FIG. 32, the resist 60 is removed. Selective etching of the silicon oxide films 15 and 17 and silicon nitride film 16 is then performed, thereby removing the silicon oxide films 15 and 17. Consequently, an L-shaped silicon nitride film 16 is formed. After that, an L-shaped hard mask HM is formed by processing the silicon nitride film 14 by using the silicon nitride film 16.

Subsequently, as shown in FIG. 27, a stacked magnetic film 13 is etched by using the L-shaped hard mask HM, thereby forming an L-shaped MTJ element MTJ.

The rest is the same as in each of the above embodiments. That is, a silicon oxide film 21 having high gap filling capability is deposited between the MTJ elements MTJ and etched back by RIE, thereby partially exposing the MTJ elements MTJ. After that, a metal material such as aluminum is deposited on the MTJ elements MTJ and silicon oxide film 21, and interconnections 22 are formed by RIE.

[7-3] Effects

In the seventh embodiment described above, the fine L-shaped MTJ element MTJ is formed. The width W of the MTJ element MTJ is determined by the deposited film thickness of the silicon nitride film 16 as a part of the hard mask HM to be used when processing the MTJ element MTJ. Accordingly, the dimensions of the MTJ element MTJ can be freely determined by controlling the film thickness of the silicon nitride film 16 independently of the resolution of an exposure apparatus. Since the MTJ element MTJ can be downsized, therefore, the memory cell can also be downsized.

[8] Eighth Embodiment

In the eighth embodiment, the MTJ element used in each embodiment will be explained.

[8-1] Tunnel Junction Structures

The MTJ element MTJ can have a single-tunnel-junction (single-junction) structure or double-tunnel-junction (double-junction) structure.

A single-tunnel-junction MTJ element MTJ has a fixed layer having a fixed magnetization direction, a recording layer having a reversible magnetization direction, and a nonmagnetic layer formed between the fixed layer and recording layer. That is, the MTJ element MTJ has one nonmagnetic layer.

A double-tunnel-junction MTJ element MTJ has a first fixed layer, a second fixed layer, a recording layer formed between the first and second fixed layers, a first nonmagnetic layer formed between the first fixed layer and recording layer, and a second nonmagnetic layer formed between the second fixed layer and recording layer. That is, the MTJ element MTJ has two nonmagnetic layers.

The MR (Magneto Resistive) ratio (the change ratio of the resistance in state "1" to that in state "0") of the double-tunnel-junction structure deteriorates less than that of the single-tunnel-junction structure when the same external bias is applied, so the double-tunnel-junction structure can operate with a bias higher than that of the single-tunnel-junction structure. That is, the double-tunnel-junction structure is advantageous when reading out information from a cell.

[8-2] Magnetization Arrangement

The magnetization directions in the fixed layer and recording layer of the MTJ element MTJ can be perpendicular to the film surfaces (a perpendicular magnetization type element), or parallel to the film surfaces (a parallel magnetization type element or longitudinal magnetization type element).

Note that the perpendicular magnetization type MTJ element MTJ has the advantage that the longitudinal direction of the element shape does not determine the magnetization direction unlike in the conventional element.

[8-3] Materials

Examples of the materials of the MTJ element MTJ are as follows.

As the material of the fixed layer and recording layer, it is favorable to use any of Fe, Co, Ni, alloys of these metals, magnetite having a high spin polarization ratio, oxides such as $CrO_2$ and $RXMnO_{3-y}$ (R; a rare earth element, and X; Ca, Ba, or Sr), and Heusler alloys such as NiMnSb and PtMnSb. These magnetic materials may also contain more or less nonmagnetic elements such as Ag, Cu, Au, Al, Mg, Si, Bi, Ta, B, C, O, N, Pd, Pt, Zr, Ir, W, Mo, and Nb, provided that the materials do not lose their ferromagnetism.

As the material of the nonmagnetic layer, it is possible to use various dielectric materials such as $Al_2O_3$, $SiO_2$, MgO, AlN, $Bi_2O_3$, $MgF_2$, $CaF_2$, $SrTiO_2$, and $AlLaO_3$. Oxygen, nitrogen, and fluorine deficiencies may exist in these dielectric materials.

An antiferromagnetic layer for fixing the magnetization direction in the fixed layer may also be formed on the surface of the fixed layer away from the surface opposing the nonmagnetic layer. As the material of this antiferromagnetic layer, it is favorable to use, e.g., Fe—Mn, Pt—Mn, Pt—Cr—Mn, Ni—Mn, Ir—Mn, NiO, or $Fe_2O_3$.

Moreover, the present invention is not limited to the above embodiments and can be variously modified when practiced without departing from the spirit and scope of the invention. For example, in each of the above embodiments, a current induced magnetization reversal type of spin injection magnetization reversal type magnetic random access memory is taken as an example. However, the present invention is also applicable to a two-terminal resistance change memory such as a phase change random access memory (PRAM) or resistive random access memory (RRAM). In the RRAM, a resistance change element using the CER (Colossal Electro-Resistance) effect is used instead of the MTJ element. In the PRAM, a phase change element using the crystal phase change is used instead of the MTJ element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a first resistance change element having a first portion and a second portion, the first portion and the second portion having a first space in a first direction; and
a second resistance change element formed to have a distance to the first resistance change element in a second direction perpendicular to the first direction, and having a third portion and a fourth portion, the third portion and the fourth portion having a second space in the first direction, and the first space and the second space being shorter than the distance, the first portion, the second portion, the third portion and the fourth portion being separated physically.

2. The device according to claim 1, wherein each of the first resistance change element and the second resistance change element comprises one of:

a magnetoresistive effect element having a fixed layer in which a magnetization direction is fixed, a recording layer in which a magnetization direction reverses, and a nonmagnetic layer sandwiched between the fixed layer and the recording layer;

a resistance change element using a CER effect; and a phase change element using a crystal phase change.

3. The device according to claim 1, wherein the first resistance change element further has a fifth portion and a sixth portion, the second resistance change element further has a seventh portion and an eighth portion, the first portion, the second portion, the fifth portion, and the sixth portion are separately arranged at apexes of a quadrangle, and the third portion, the fourth portion, the seventh portion, and the eighth portion are separately arranged at apexes of a quadrangle.

4. The device according to claim 3, wherein the first portion and the fifth portion have a third space in the second direction, the third portion and the seventh portion have a fourth space in the second direction, and the third space and the fourth space are shorter than the distance.

5. The device according to claim 4, wherein the first space, the second space, the third space, and the fourth space are equal.

6. The device according to claim 1, wherein the first portion, the second portion, the third portion, and the fourth portion are linear shapes extending in the second direction.

7. The device according to claim 6, wherein a length in the second direction of each of the first portion, the second portion, the third portion, and the fourth portion is equal to the distance.

8. A semiconductor memory device comprising:

a plurality of resistance change elements including a first resistance change element and a second resistance change element formed apart from the first resistance change element in a first direction, the plurality of resistance change elements being included in respective cells and being separated physically;

a first contact connected to the first resistance change element and having a first portion and a second portion, the first portion and the second portion having a first space in the first direction; and a second contact connected to the second resistance change element, formed to have a distance to the first contact in the first direction, and having a third portion and a fourth portion, the third portion and the fourth portion having a second space in the first direction, and the first space and the second space being shorter than the distance.

9. The device according to claim 8, wherein the first contact further has a fifth portion and a sixth portion, the second contact further has a seventh portion and an eighth portion, the first portion, the second portion, the fifth portion, and the sixth portion are separately arranged at apexes of a quadrangle, and the third portion, the fourth portion, the seventh portion, and the eighth portion are separately arranged at apexes of a quadrangle.

* * * * *